United States Patent [19]

Bolan et al.

[11] Patent Number: 5,684,828
[45] Date of Patent: Nov. 4, 1997

[54] WIRELESS DATA MODULE WITH TWO SEPARATE TRANSMITTER CONTROL OUTPUTS

[75] Inventors: Michael L. Bolan, Dallas; Donald R. Dias, Carrollton; William Lee Payne, II, Garland, all of Tex.

[73] Assignee: Dallas Semiconductor Corp., Dallas, Tex.

[21] Appl. No.: 541,654

[22] Filed: Oct. 10, 1995

Related U.S. Application Data

[63] Continuation of Ser. No. 156,963, Nov. 23, 1993, abandoned, which is a continuation of Ser. No. 527,492, May 22, 1990, abandoned, which is a continuation-in-part of Ser. No. 283,140, Dec. 9, 1988, abandoned, and Ser. No. 352,596, May 15, 1989, Pat. No. 4,948,954.

[51] Int. Cl.$^6$ .................. H03K 7/08; H04B 1/38
[52] U.S. Cl. .......... 375/238; 375/219; 340/825.08; 340/825.54
[58] Field of Search .................. 375/238, 211, 375/219, 309, 295, 340, 316, 259; 455/89, 88, 68, 11, 24, 105, 56.1; 340/825.54, 825.31, 825.08, 825.32, 572; 342/42.44

[56] References Cited

U.S. PATENT DOCUMENTS

| | | |
|---|---|---|
| 4,048,729 | 9/1977 | Derks . |
| 4,471,345 | 9/1984 | Barrett, Jr. ............... 340/825.32 X |
| 4,473,825 | 9/1984 | Walton ..................... 340/825.54 |
| 4,602,253 | 7/1986 | Kreft . |
| 4,688,036 | 8/1987 | Hirano et al. ............. 340/825.54 X |
| 4,691,202 | 9/1987 | Denne et al. ............. 340/825.54 |
| 4,724,427 | 2/1988 | Carroll ....................... 340/825.54 X |
| 4,740,792 | 4/1988 | Sagey et al. . |
| 4,742,470 | 5/1988 | Juengel ..................... 340/825.54 X |
| 4,766,295 | 8/1988 | Davis et al. . |

OTHER PUBLICATIONS

Bursky, Dave, "Talking Over rf Links, Micropower ICs Transfer Data and Status," Aug. 25, 1988 issue of *Electronic Design*.

*Primary Examiner*—Tesfaldet Bocure

[57] ABSTRACT

A wireless-accessible module which provides first and second wireless-transmitter control signals, such that the first transmitter control signal can be activated automatically, in response to incoming wireless signals, but the second transmitter control signal can only be activated by manual input or direct command. Preferably the two control signal outputs are used to select the power level of transmission on a single predetermined frequency; but alternatively these outputs may be used to control two different RF transmitters and/or two different antennas.

11 Claims, 10 Drawing Sheets

PIN DESCRIPTION

16-PIN SOIC
(300 MIL)

WIRELESS DATA MODULE WITH TWO SEPARATE TRANSMITTER CONTROL OUTPUTS

CROSS-REFERENCE TO OTHER APPLICATIONS

This application is a continuation of application Ser. No. 08/156,963, filed on Nov. 23, 1993, which was abandoned upon the filing hereof, which is a continuation of application Ser. No. 07/527,492 filed May 22, 1990, abandoned, which is a continuation-in-part of, and claims priority under 35 USC §120 from, the following commonly owned applications:

U.S. application Ser. No. 283,140, Filed Dec. 9, 1988, abandoned, entitled "DECODER ARCHITECTURE FOR VARIABLE-SYMBOL-DURATION CODING" (DSC-43); and U.S. application Ser. No. 352,596, Filed May 15, 1989, U.S. Pat. No. 4,948,954 entitled "INTERFACE FOR RECEIVING ELECTRONIC TOKENS" (DSC-158);

PCT Application Ser. No. PCT/US 90/02891, Filed May 15, 1990, entitled "SYSTEMS WITH DATA-TOKEN/ONE-WIRE-BUS" (DSC-83PCT);

all of which are hereby incorporated by reference.

The following applications of common assignee contain related subject matter, and are believed to have effective filing dates identical with that of the present application:

U.S. Ser. No. 527,496, filed May 22, 1990, abandoned entitled "WIRELESS DATA MODULE WHICH SYNCHRONIZES ITS DATA TRANSMISSIONS TO AN INCOMING UNMODULATED LOW-FREQUENCY CARRIER" (DSC-267);

U.S. Ser. No. 527,484, filed May 22, 1990, abandoned entitled "DATA MODULE WITH TRUNCATABLE DOWNLOADING OF PREDETERMINED DATA FIELDS" (DSC-269);

U.S. Ser. No. 527,495, filed May 22, 1990, abandoned entitled "WIRELESS DATA MODULE WITH QUASI-RANDOM SILENT TIMES" (DSC-270); all of which are hereby incorporated by reference.

BACKGROUND AND SUMMARY OF THE INVENTION

The present invention relates to portable wireless-accessible data modules, and to systems which include such modules.

Systems which can provide short-range wireless data communication between a base station and a portable low-power module have recently been the subject of development efforts by a number of groups. Such systems can be extremely useful in many contexts, such as control of personnel access to secure facilities, medical monitoring of inpatients, automated livestock management, automated manufacturing generally, inventory control, theft control, and others described below.

However, such a system is subject to many constraints. First, the maximum power levels for RF (radio-frequency) emissions are stringently limited by law. Second, if the portability of the portable stations is to be maximized, the battery weight must be small, and this means that the power consumption of the portable module—in active or in standby mode—must be exceedingly low. Third, many possible applications are highly cost-sensitive. Moreover, in many such applications, the size and weight of the portable module are also extremely sensitive. A module which is merely transportable will not suffice. For example, pagers and portable radios have often had weights of 10 ounces or more, and volumes of 10 cubic inches or more. If modules of this size were used (for example) for patient identification in a hospitals, the patients would unload such cumbersome objects as quickly as possible, by any means possible. Similarly, in many applications such large modules could not be used for inventory control, since there would be no convenient place to put them, and they would easily be damaged (or personnel would learn to bypass them).

In most applications, rechargeable batteries are not suitable for a power supply. Rechargeable batteries not only impose a user burden (to perform recharging), but also tend to have electrical characteristics which may be dependent on the discharge/recharge history of the particular battery. Many possible applications cannot tolerate such uncertainty, and require a degree of reliability which demands a very conservative approach to power supply design and rating.

The need to conserve power actually implies several separate constraints: the consumption requirements of both the active and the standby mode must be separately minimized, and the issues to be considered are somewhat different.

Parent application 283,140 (DSC-43) described a preferred embodiment in which a low-power RF interface was defined so that multiple base stations can each broadcast a short-range query signal, on a relatively low frequency carrier; and, when any one portable data module receives this query signal, it can then respond, in slave mode, with a data signal at a higher frequency.

The present application sets forth a number of innovations which can be used in this system configuration or in other system configurations. The presently preferred system embodiment uses a low-power RF interface between base stations and portable modules. However, a number of the disclosed innovations are also applicable to systems which do not use this frequency allocation, to systems which use other forms of wireless interfacing, and/or to data-module/base-station systems which do not use a wireless interface.

Direct Digital Detection of RF Inputs

As noted above, a portable data module must achieve adequate power conservation in both the active and the standby modes. The most difficult issues are presented by the standby mode. Of course, a micropowered portable module cannot afford the power to continually broadcast a beacon; but even listening for a beacon from a base station imposes significant power requirements.

Suppose, for example, that a portable data module, with nonrechargeable batteries, is desired to have a lifetime of at least 10 years, and to be able to perform at least 1,000,000 data transactions during its lifetime. (This is an extremely aggressive set of specifications.) Suppose further that the available battery energy is 2000 Joules (1 milliampere for 190 hours at 3 Volts). Then the power dissipation in the standby mode must be no more than several millionths of a Watt, or all of the battery energy will be dissipated merely in waiting for the active communication transactions to begin, before the design lifetime has expired.

One approach to coping with this power constraint, as disclosed in parent application 283,140 (DSC-43), is to use a micropowered RF receiver which does not use any analog gain stages for detection of the incoming RF signals. Instead, the incoming RF analog signals are connected directly to a comparator: No analog gain stages are used, either before or after the comparator, and the comparator's input terminals are directly connected to an all-passive antenna circuit. This provides reasonable (but not high) sensitivity, without consuming large amounts of power in the standby mode.

Greater sensitivity could achieved if op amp stages could be used for detection; but this would significantly increase power consumption.

Portable Data Module with Split Frequency Allocation

Parent application 283,140 (DSC-43) describes a system where a split frequency allocation is used on the RF channel. The base stations transmit data at a relatively low frequency (referred to herein as the "write-data" frequency), and the portable modules transmit at a much higher frequency (referred to herein as the "read-data" frequency). The transmitter powers used are very limited (both by regulatory constraints and by battery energy limits), and these limited power levels permit communication over only a very short range.

However, given the power constraints, it is still desirable to increase range if possible. (For example, the difference between a 5-foot range and a 10-foot range may make a significant contribution to user convenience.) Moreover, in many applications of interest, the effective range may be drastically reduced by the environment. For example, the large quantity of sheet metal in a car may reflect or attenuate RF signals so that the range is reduced by a factor of 3 or 10 from the free-space range.

In such systems, it has been found that the range tends to be limited by the link from the base station to the portable module. Thus, the question becomes: how can the range of the low-frequency transmissions, from the base station to the portable module, be increased?

There are, in principle, several approaches which might be considered, but many of these approaches are incompatible with the general system design and environment described above.

One might consider increasing the base station's transmitter power, but this is precluded by regulatory constraints.

One might consider increasing the base station's transmitter directionality, but this places constraints on the locus of receivers, and may not be possible in all cases.

One might consider increasing the portable module's receiver sensitivity, but, as discussed above, this is not consistent with the preferred tight power budget.

One might consider increasing the Q of the portable module's receiving antenna[1] (which would provide a higher voltage at the antenna terminals); but this approach too runs into constraints. In systems as described in parent application 283,140 (DSC-43), it has been discovered that the use of a relatively low frequency carrier (200 kHz, in the preferred embodiment disclosed there) for transmission from the base station imposes some limits on the Q of the antenna used in the portable module to receive this transmission. With the scheme there described, it was discovered that, for use with the communications rates and protocols there described, the antenna circuit was most preferably detuned, to give a Q less than 10, in order to capture the full bandwidth of the incoming signal.[2] However, this has the disadvantage that the minimum range is reduced. Thus, the problem is that, although a higher Q on the receiving antenna will increase range, it will also decrease the data rate. This is most undesireable.

[1] The term "Q" (which originally stood for "quality factor," but is now used alone) provides a measure of how sharply tuned a resonantor is. The Q of a circuit is the ratio of stored resonating energy to the energy dissipated per cycle. The lower the Q of a circuit, the broader the frequency range over which the circuit will resonate. See generally Johnson and Jasik, *Handbook of Antennas;* R. Feynman, *Lectures on Physics;* and the latest editions of the *Radio Amateur's Handbook,* the *Antenna Book,* and the *VHF Manual,* available from the American Radio Relay League. All of these materials are hereby incorporated by reference.

[2] When an RF carrier is modulated or keyed to carry data, the resulting signal will have an increased bandwidth. At least some of this increased bandwidth is required to carry information. For example, if a carrier at frequency $f_C$ is directly modulated by an analog signal which has a bandwidth of from $f_L$ to $f_H$, the resulting signal will contain energy not only at the carrier frequency $f_C$, but also (at least) in a lower sideband (which extends from frequency $f_C-f_H$ up to frequency $f_C-f_L$), and in an upper sideband (which extends from frequency $f_C+f_L$ up to frequency $f_C+f_H$). If the modulated signal were filtered too narrowly to include at least one of these sidebands, some of the information in the analog signal would be lost. Other modulation or coding schemes may produce other spectra, but the general principle is the same.

Portable Powered Read/Write Data Module with Read-Only Wireless Access

One of the ideas behind the presently preferred embodiment is that many of the advantages of a wireless interface to a portable battery-powered read/write data module can be enjoyed if the wireless interface is used only for reading the data module, and another access path (through electrical contacts) is used for write transactions (which can be repeated as needed).

Data Module's Transmissions Synchronized to Incoming LF Sine Wave

In the present invention, the portable data module is operated in read-only mode (at least while being queried in this mode). The base station can broadcast an essentially pure, unmodulated, unkeyed carrier wave as a low-power query signal, to poll for portable modules in its vicinity. The portable modules have receiving antenna circuits tuned to this carrier frequency (which is predetermined for a given system). (Preferably (but not necessarily) the portable modules include receiving antenna circuits with a Q of at least 10, and ideally 100 or more.) When a portable module receives such a carrier, it replies with a data transmission at a higher (predetermined) frequency.

A notable innovative point is that, when a portable module replies with a data transmission, that data transmision is synchronized to the incoming carrier (or a subharmonic of it). Thus, the carrier transmitted by the base station is used not only to detect proximity, but also to provide a data clock which is known to both the base station and the portable module.

In the presently preferred embodiment, the portable module generates a pulse train which is synchronized to the zero crossings of the received low-frequency signal to trigger pulses. This pulse train is divided down by a programmable divide-by-n counter to generate a data clock, and this data clock is used to clock the bits of data which are sent to the module's transmitter. The base station can detect this transmission more easily, because the base station already knows (to within 1 of n phases) exactly what the timing of the transmission's data clock is. The base station will have to detect which of the n possible data clock phases is being followed by the portable module, but this is a simple detection problem, as described below.

Wireless-Access Data Module with Both Automatic and Manual Activation

Among the disclosed innovations is a wireless-accessible module which can not only respond automatically to wireless queries with a wireless transmission, but which can also be commanded, by a direct user input, to send a wireless transmission.

This may be useful, for example, in an access-control application, where the user must not only provide the correct identification in response to a query, but also send an "unlock" command.

In the presently preferred embodiment, the control logic can drive either of two different transmitter-control signals, on two different wires, in response to these different sources of activation: the first transmitter control signal can be activated automatically, in response to incoming wireless signals, but the second transmitter control signal can only be activated by manual input or direct command. Preferably the two control signal outputs are used to select the power level of transmission on a single predetermined frequency; but alternatively these outputs may be used to control two different RF transmitters and/or two different antennas.

In the United States, FCC regulatory requirements set two relevant power ceilings: manually activated transactions must stay below a first threshold, but automatically generated transactions must stay below a second, much lower threshold.

Battery lifetime considerations also support a dual threshold. Automatic responses may be triggered very frequently, in a worst-case environment; but manual responses can be predicted to have a much lower, and much more predictable, maximum occurrence rate.

Thus, for both of these reasons, the availability of separate output modes is advantageous.

Data Module with Truncatable Output from Fixed-Length Data Field

Another of the innovative points disclosed herein is a data module which includes a nonvolatile memory and which outputs a predetermined field of data, beginning at a predetermined address of said memory, in response to a predetermined query command; wherein the module is programmable, separately from ones of said query commands, to output only the first N bits of said predetermined field in response to said predetermined query, wherein N is a programmed value.

This teaching, in particular, is not only applicable to wireless-accessible modules. Many highly constrained systems (whose definition is constrained by low power budget, low cost requirements, and/or a requirement for small physical size and weight) provide "minimal" architectures, wherein small memory space and/or low data rates must be accepted.

In such minimal architectures, a data output requirement may sometimes be satisfied by dumping a particular block of memory. Of course, the memory block allocated for such a use must be larger than the longest data sequence which will have to fit into it; but this implies some waste of data transmission time.

Within the constraints of such a minimal architecture, the disclosed innovation provides a significant improvement. In the presently preferred embodiment, there is a programmable bit, for each of the memory blocks which can be "dumped," which specifies how many bits of the memory block will be output. Thus, for example, if a 17-bit code is stored in a 128-bit memory block, it is not necessary to output all 128 bits.

This not only speeds up transactions, but also economizes on power.

System with Non-Specific Polling of Portable Data Modules

In the preferred embodiment disclosed in parent application 283,140 (DSC-43), modules could be polled selectively (with module identifiers); but without data transmission over the low-frequency link, this is no longer possible.

Thus, the described system provides non-specific polling of data modules. In such a system, problems could arise if two data modules are within range of a base station which is polling. If every module in range responds to polling, the base station might not be able to recognize them.

In the presently preferred embodiments, the modules respond to polling by a pseudo-random cycle of active and quiet times. Thus, when a base station queries multiple modules, all modules may intially answer at once; but thereafter the modules will cycle through active and quiet periods, until, if not too many modules are present, the base station will get a chance to hear each module in isolation. The duty cycle parameters are chosen so that a base station can identify each of several modules within range. This will be sufficiently robust for many applications of interest.

Preferred System Context of the Present Invention

Many of the innovative teachings of the present application will initially be described in the context of an embodiment, as shown in FIG. 3, wherein RF communication is established between a base station and one or more portable data modules. Each portable module can be read out by a base station 110, whenever the portable module comes within range of the base station.

A split frequency allocation is used on the RF channel. The base station transmits at a relatively low frequency (referred to herein as the "low-frequency[3] carrier" frequency), and the remote module transmits at a much higher frequency (referred to herein as the "UHF"[4] frequency). The transmitter powers used permit communication over a very short range.

The portable data module is preferably extremely compact, and is powered by an small non-rechargeable battery. The base station is assumed not to be power-limited, but of course the innovative teachings set forth herein could also be applied to systems where some of the base stations are micropowered and/or some of the portable modules are not micropowered.

[3]However, this frequency need not be part of the LF band (30–300 kHz), but may be lower or higher.
[4]However, this frequency need not be part of the UHF band (300–3000 MHz), but may be lower or higher.

Electronic Key Applications

The disclosed architecture is particularly advantageous for electronic key uses. For example, the disclosed preferred embodiments are particularly useful for car keys. For example, the vehicle's computer may be set up to repeatedly (or continuously) verify the presence of the correct wireless key while the vehicle is in operation, and initiate a shutdown if the correct wireless key is not present. For another example, the user's key module may be set up to not only provide automatic identification, but also provide manual activation for functions such as garage door openers.

Some Issued Patents Showing Wireless Identification or Tags

There have been some attempts to develop read-only modules for wildlife identification (and similar purposes). However, such modules are not known to use the innovations disclosed herein. In any case, many such modules were designed for significantly different operation than the disclosed preferred embodiments. Some examples of proposed[5] systems include the following issued U.S. patents, all of which are hereby incorporated by reference:

[5]These patents may not all be prior art to the inventions disclosed or claimed in the present application.

U.S. Pat. No. 4,885,571 to Pauley et al. ("Tag for use with personnel monitoring system") purports to show "A tag for use with an individual monitoring system. The tag is worn by an individual being monitored, preferably on the ankle or leg where it can be concealed by the clothing of the individual. The tag is fully self contained and sealed. The circuits of the tag periodically generate an identification signal that includes an identication code. The identification signal modulates a stable RF signal that is transmitted in bursts of data words to a receiver associated with a field monitoring device (FMD) located at the monitoring location. In turn, the FMD may randomly establish communication with a central processing unit (CPU) located at a central monitoring location. Other information is included in the identification code of the tag, such as information indicating that an attempt has been made to remove the tag from the individual."

U.S. Pat. No. 4,851,815 to Enkelmann ("Device for the monitoring of objects and/or persons") purports to show "A device for the monitoring of objects and/or persons is described which comprises an RF transmitter and a security tag with a casing for accommodating an electronic circuit. The electronic circuit contains a battery and an alarm circuit. An alarm is triggered when an electrically conductive security element for attaching the security tag to the object or to the person is severed or when an external RF field generated by the RF transmitter has a defined state. The RF transmitter is here designed with an encoder for coding the RF signal, while in the electronic circuit of the security tag a decoder is provided which outputs an alarm signal to the alarm circuit to trigger an alarm when a defined information content of the coded RF signal is present."

U.S. Pat. No. 4,766,295 to Davis et al. ("Electronic pricing display system") purports to show "An electronic pricing display system for displaying pricing and other specialized information in real time on shelf display tags. Display tags are battery operated and receive remotely transmitted infrared signals from optical heads mounted on the ceiling of a store. A handheld electronic controller may be carried by store personnel for obtaining information from or sending information to a selected wireless display tag. Pricing information from a main computer is connected by an electronic interface including a microprocessor into a serial information stream having two separate frequencies for relay to the optical heads."

U.S. Pat. No. 4,740,792 to Sagey et al. ("Vehicle location system") purports to show "A vehicle locating system (VLS) comprises a large number, for example, several million, vehicle-mounted transmitters and several benchmark transmitters; first, second and third signal relay stations and a central processing station at which the transmitter locations are determined, the central station being connected by conventional links to subscriber stations. One hundred microsecond-long RF signals are transmitted by each transmitter in a non-synchronized, mutually random manner. Each signal comprises a 20 microsecond synchronization symbol followed by six, four bit transmitter identification symbols, each of ten microseconds length. Following the identification symbols are 10 microsecond message and processing symbols. The control station includes correlation means for correlating the synchronization symbols on each relayed signal against stored data to identify the beginnings of the signals. Identification symbols of each signal are then decoded by correlation means to establish transmitter identification, a combination of $16^6$ possible identifications being provided. Signals arriving in the central station are time-tagged upon arrival and the time differences of arrival (TDOA) are used to compute transmitter location. Benchmark transmitter computed locations are used to calibrate the VLS. Means may be provided on the vehicle transmitters to enable the rate of transmissions to be varied, to thereby enable encoding preselected messages relating, for example, to vehicle motion, vehicle crashes and vehicle intrusion/theft, responsive to associated sensors. Alternatively, or in addition, specific, prestored messages may be encoded into the transmitted signals manually or automatically in response to sensor input."

U.S. Pat. No. 4,688,026 to Scribner et al. ("Method of collecting and using data associated with tagged objects") purports to show the following: "Tags capable of wirelessly transmitting unique codes when energized by radio frequency (RF) energy are used to identify a variety of different locations and objects. A portable battery-powered unit having digital storage capabilities is designed to be transported to the general location of the tagged locations and objects. The user moves an RF antenna sufficiently close to the tag to energize it and cause the tag to transmit its code. The detected code is then stored in digital form in a memory. The location tags contain an association or master list of the objects associated with that particular location. The method finds particular utility in performing inventory control of furniture or other objects since the tags can be mounted at points thereon that are not readily observable, thereby preserving their aesthetic appearance. Other methods include patient identification in a health care facility, project scheduling, quality control, interior decorating, or any other procedure where identification of a particular object or location is a preliminary step before proceeding with further work. Preferably, a programmable device having a display is used to prompt the operator after the object or location has been detected."

U.S. Pat. No. 4,646,090 ("Codeable identifying tag and method of identification thereof") purports to show "A tag [which] is receptive of two radio frequencies (RF signals) for mixing the two frequencies and radiating a signal which is either or both the sum and difference of the two RF frequencies. A uniquely identifiable tag includes, in addition to the mixer one or more filters for radiating a signal only when the sum or difference of the two signals is a pre-specified value or only when the RF signals are each of pre-selected values."

U.S. Pat. Nos. 4,532,892 and 4,463,353 to Kuzara (both entitled "Animal feeding and monitoring system") each purport to show "The animal feeding and monitoring system includes an electronic identity tag having a code generator for generating a coded identifier signal uniquely associated with an animal to be identified. Electromagnetic energy from an RF field generator mounted in a feeding station is coupled into a pick-up coil in the electronic identity tag when the animal wearing the electronic identity tag approaches the feeding station. Electromagnetic energy coupled into the pick-up coil serves a source of power for the operating components of the tag. The code generator generates the coded identifier signal in response to timing pulses supplied by either an independently set RC oscillator circuit or a countdown circuit connected to the pick-up coil. A voltage detector connected to the pick-up coil is connected to gate the coded identifier signal transmissions only when sufficient power to provide error-free operation of the code generator has accumulated in the pick-up coil. Once the animal has been identified, certain control and monitoring functions can be performed under the command of a central computer. The central computer can direct the delivery of feed to the identified animal in accordance with that animal's feeding requirements. Where the animal to be identified is a cow, feed consumption, milk production and temperature measurements for a particular cow can be obtained and stored over a period of time, enabling the central computer to determine the feeding requirements for that cow. Additional monitoring and diagnostic routines can be performed by the central computer to ascertain whether the cow is in heat or has mastitis. A multiplexing arrangement permits these various control, monitoring and diagnostic routines to be performed for a plurality of animals located in adjacent feeding stations."

U.S. Pat. No. 4,048,729 to Derks ("Electrical teaching system") purports to show "A wireless electrical teaching system includes an instructor operated console with a plurality of lesson sources and means for transmitting the lesson source information to students, each having a transceiver unit which can be used to select one of the desired lesson sources. The console includes means for generating a unique student identification code transmitted on a common carrier frequency for all students but identifying an individual student for purposes of monitoring the student's progress during a lesson or for intercommunications between the instructor and a student. Each of the student transceivers include code detecting means responsive only to the unique code identifying the student for generating a control signal which actuates a student transmitter for transmitting the student's voice back to the instructor during a monitoring mode of operation. The console also includes an intercom transmission circuit and a circuit for modifying the student code. The student's transceiver includes control means for automatically muting the lesson source when a modified code is received and tuning the student receiver to the intercom transmission circuit pemitting intercommunications between the instructor and the student at the same adjustable audio level as the lesson source selected by the student."

BRIEF DESCRIPTION OF THE DRAWING

The present invention will be described with reference to the accompanying drawings, which show important sample embodiments of the invention and which are incorporated in the specification hereof by reference, wherein.

DESCRIPTION OF THE PREFERRED EMBODIMENTS

The numerous innovative teachings of the present application will be described with particular reference to the presently preferred embodiment, but it should be understood that this class of embodiments provides only a few examples of the many advantageous uses of the innovative teachings herein. In general, statements made in the specification of the present application do not necessarily delimit any of the various claimed inventions. Moreover, some statements may apply to some inventive features but not to others.

Figure 1:
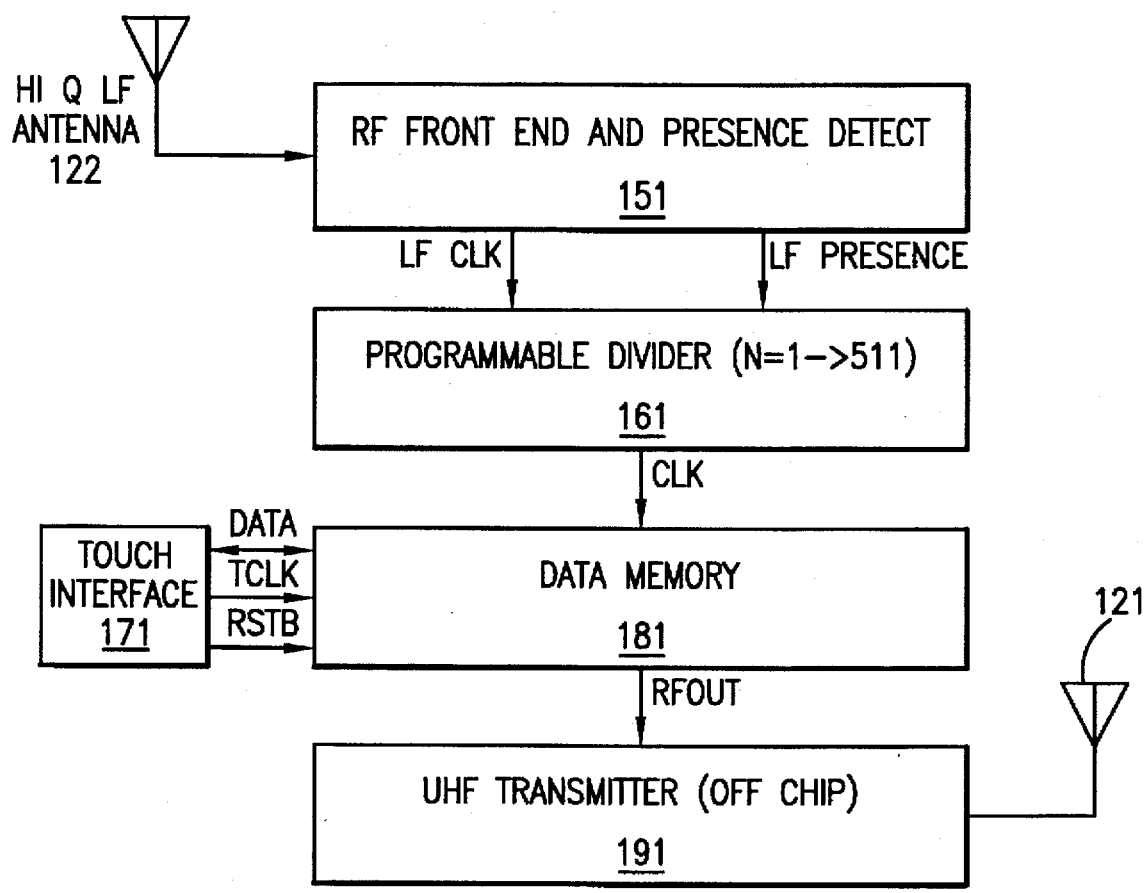
FIG. 1 is a block diagram of the portable data module of the presently preferred embodiment.

FIG. 1 is a block diagram of the portable data module of the presently preferred embodiment.

A low-frequency receive antenna 122 is tuned to the desired resonant frequency. In the presently preferred embodiment this is 200 kHz for U.S. use (or 133 kHz for European use), but of course a wide variety of frequencies can be used. In the presently preferred embodiment, the chip used can detect a wide range of frequencies (specified from 10 kHz to 499 kHz). Compact ferrite-loaded antennas, with a specified center frequency, are readily available, and are preferred for antenna 122.

Figure 2:
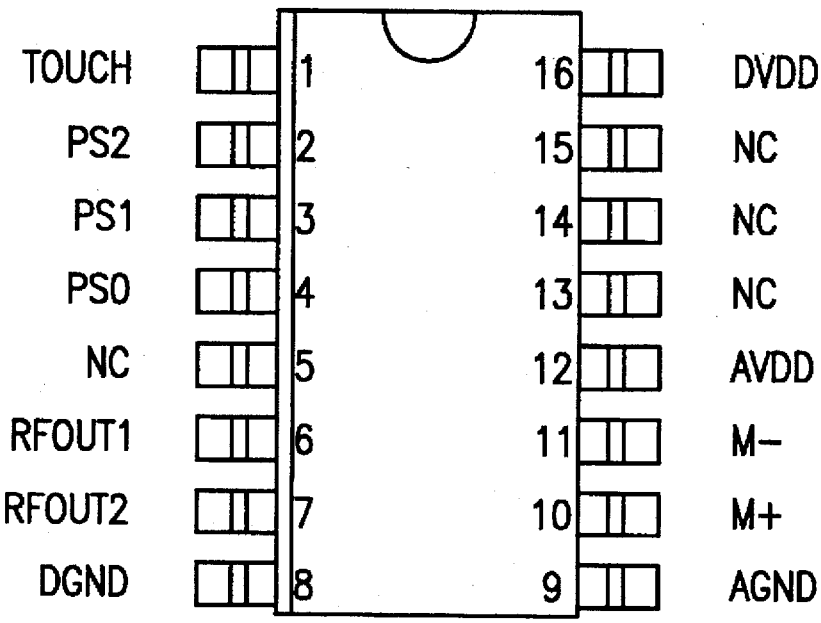
FIG. 2 shows the pinout of the integrated circuit of the presently preferred embodiment.

The RF front end and presence detect block 151 includes a comparator which is directly connected to antenna terminals M+ and M− (pins 10 and 11 in the sample pinout of FIG. 2). The details of the preferred comparator circuit are described in parent application 283,140 (DSC-43). This circuit, like circuits 161, 171, and 181, is preferably built in conventional CMOS technology.

In the presently preferred embodiment, most of the blocks shown in FIG. 1 (including blocks 151, 161, 171, and 181) are combined on a single chip. However, the UHF transmitter 191 is preferably separate (using a discrete high-frequency bipolar transistor, with its own tank circuit, for an RF driver). Of course, the antennas 121 and 122 are also off-chip.

The output of the comparator is connected to a one-shot, so that every rising edge from the comparator will trigger a pulse from the one-shot. This one-shot is connected to reset a timing circuit. The timing circuit has a fairly long time constant (e.g. 50 msec), and if the timing circuit times out the presence detect output goes low.

The other output of block 151 is the clock derived from the incoming carrier. Every time the low-frequency signal from antenna 122 crosses zero, the output of the comparator will switch state. These transitions are used to generate a clock signal.

Figure 6:
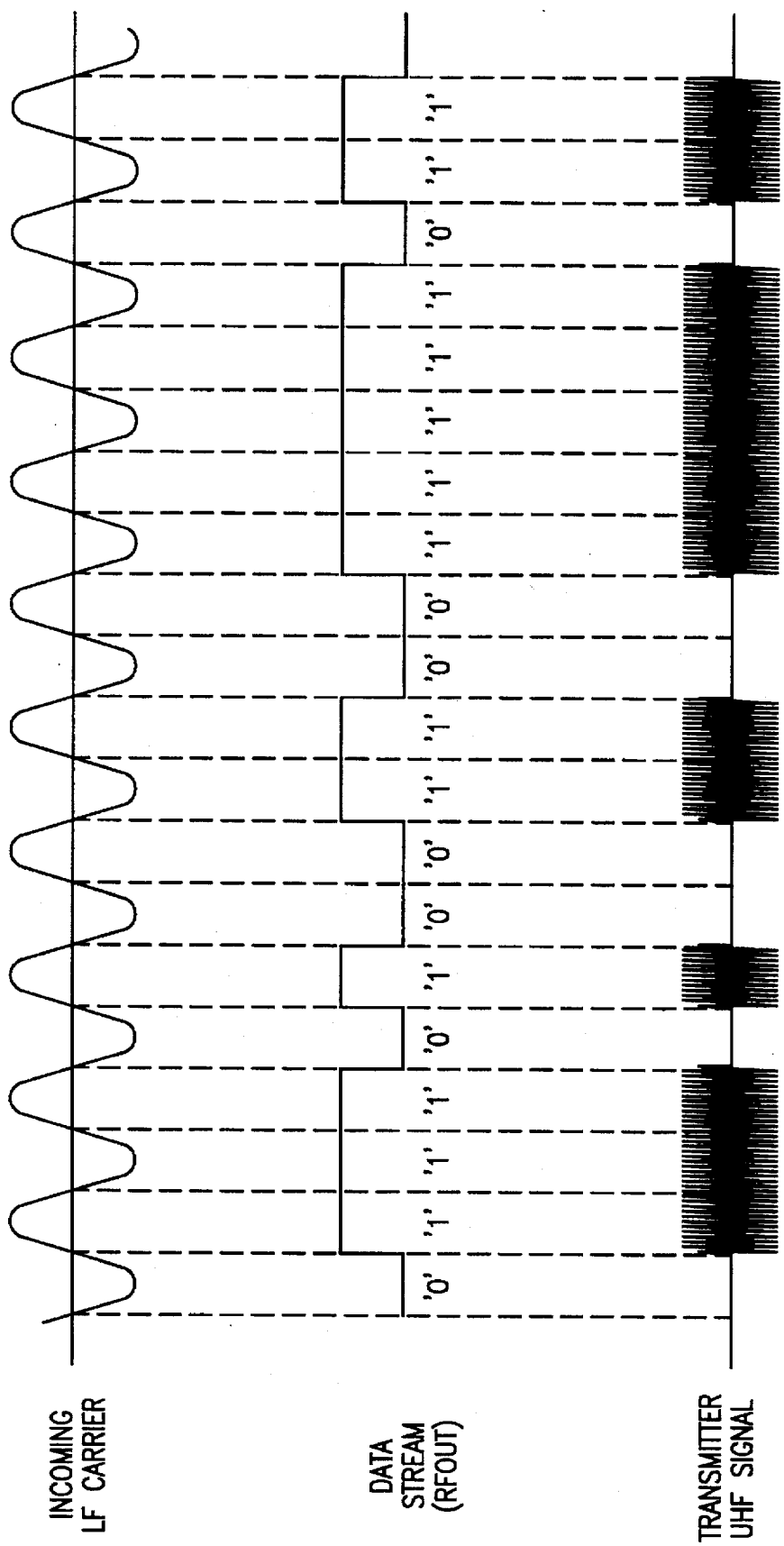
FIG. 6 is a schematic diagram showing an example of the timing relations between:
the pure carrier broadcast by the base station,
the digital signal which the portable module uses to key its RF transmitter, and
the resulting high-frequency signal.

FIG. 6 is a schematic diagram showing an example of the timing relations between the pure LF sine wave broadcast by the base station, the digital signal RFOUT which the portable module uses to key its RF transmitter, and the resulting high-frequency signal. In the example shown, the divider logic 161 has been programmed with a divisor N=1, but of course other values can be selected. In fact, a higher divisor value is preferable; but FIG. 6 is shown, for clarity, with N=1.

Note that the divisor N, as well as the two frequencies, is a variable parameter which helps to keep different systems from interfering with each other.

The divider 161 includes a counter chain, to divide down the LFCLK signal from block 151. However, the output CLK is not enabled unless the LF_PRESENCE signal indicates that a beacon is being received.

When the divider 161 drives pulses on line CLK, the memory 181 steps sequentially through the bits of data, and drives the data bits sequentially onto line RFOUT, to drive the UHF transmitter 191.

The UHF transmitter 191 is preferably a very simple combination a discrete high-frequency bipolar transistor with a tank circuit of discrete components. However, alternatively, a tremendous variety of other configurations can be used, as is well known to those skilled in the art.

FIG. 2 shows the pinout of the integrated circuit of the presently preferred embodiment. In this sample embodiment, a 16-pin SOIC package is used, but of course a wide variety of other configurations could be used.

Figure 11:
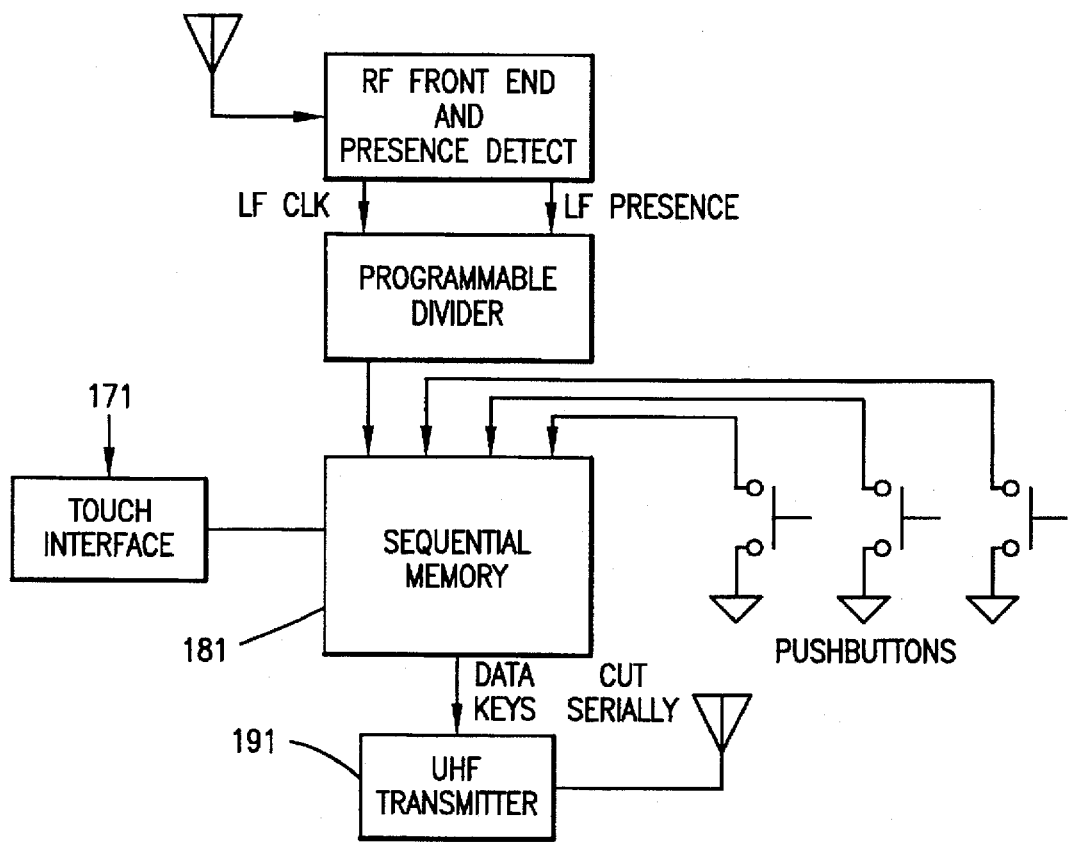
FIG. 11 is a system level block diagram of the push Buttons and the UHF transmitter keying by memory data.

The touch interface port 171 provides an alternative path into the memory 171. This port not only includes a bidirectional data link to memory 181, but also provides data and reset inputs. Write enable and start-address commands can be communicated by serial protocols over this 3-wire bus, or alternatively can be communicated by additional control lines. When this interface is accessed, the activity on line TCLK blocks out line CLK (see FIG. 11).

The module also preferably includes three different pushbuttons. Each pushbutton is connected to debounce circuitry. The input from each of these will output the data from one partition (128 bits, in the presently preferred embodiment) of the memory 181. The input from the RF front end (through divider 161) will output the data from the fourth 128-bit partition.

Activation by the pushbutton inputs overrides activation from the RF input, but access through the touch memory port 171 overrides any of these.

Figure 13:
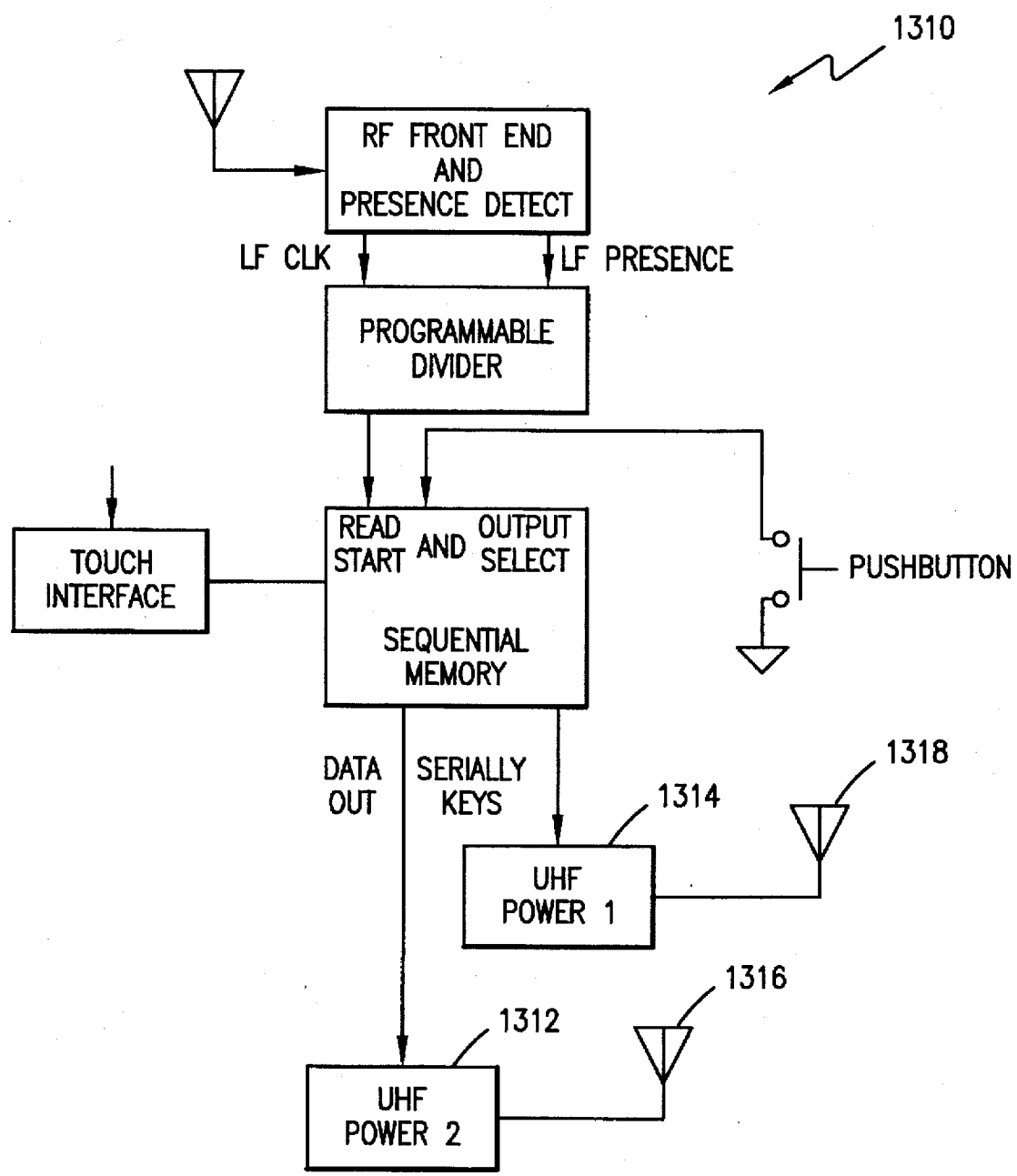
FIG. 13 is system level block diagram showing two transmitters with different power levels and both wireless query and manual pushbutton activation for keying data read out from memory.

Referring to FIG. 13, a wireless-accessible module 1310 is shown, which can not only respond automatically to wireless queries with a wireless transmission, but which can also be commanded, by a direct user input, to send a wireless transmission.

This may be useful, for example, in an access-control application, where the user must not only provide the correct identification in response to a query, but also send an "unlock" command.

In this preferred embodiment, control logic can drive either of two different transmitter-control signals, on two different wires, in response to these different sources of activation: the first transmitter control signal can be activated automatically, in response to incoming wireless signals, but the second transmitter control signal can only be activated by manual input or direct command. Preferably the two control signal outputs are used to select the power level of transmission on a single predetermined frequency; but alternatively these outputs may be used to control two different RF transmitters 1312 and 1314, and/or two different antennas 1316 and 1318.

In the United States, FCC regulator requirements set two relevant power ceilings: manually activated transactions must stay below a first threshold, but automatically generated transactions must stay below a second, much lower threshold.

Battery lifetime considerations also support a dual threshold. Automatic responses may be triggered very frequently, in a worst-case environment; but manual responses can be predicted to have a much lower, and much more predictable, maximum occurrence rate.

Thus, for both of these reasons, the availability of separate output modes is advantageous.

Figure 3:
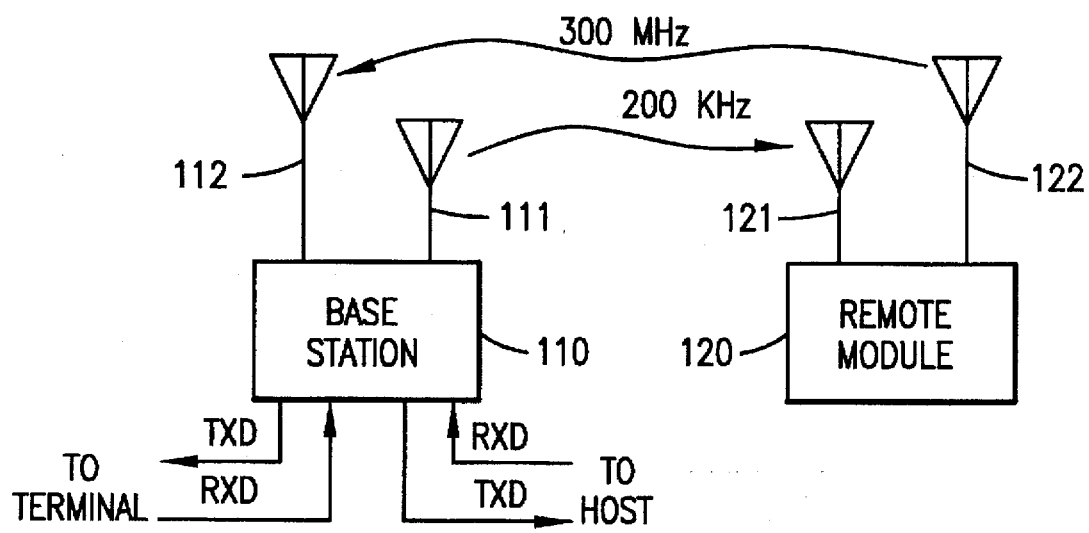
FIG. 3 is a high-level diagram of a macrosystem including at least one base station and at least one portable data module.

FIG. 3 is a high-level diagram of a macrosystem including at least one base station and at least one portable data module.

Figure 7:
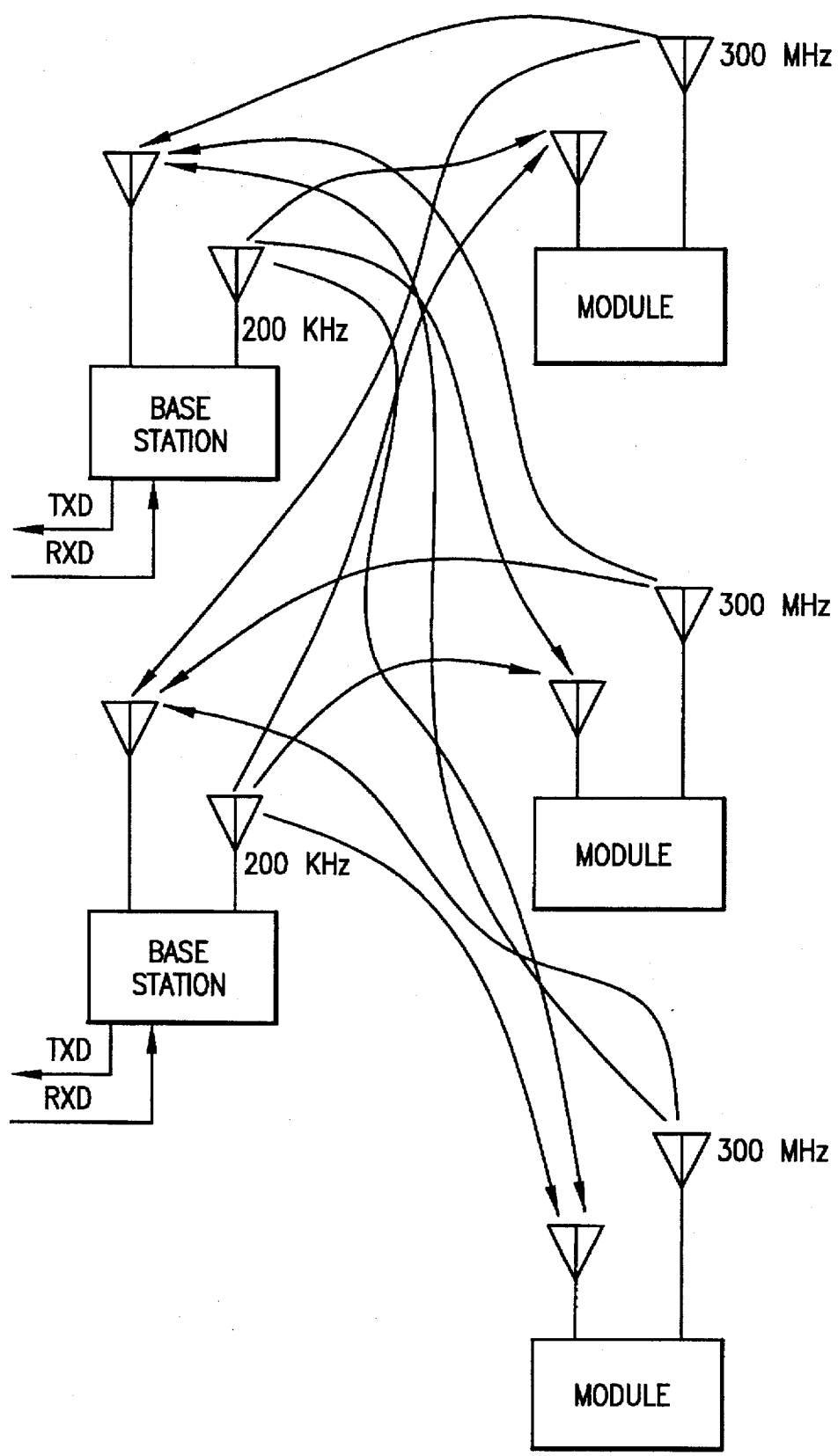
FIG. 7 is a system level block diagram showing multiple base stations and modules of the type shown in current FIG. 3.

FIG. 7 is a high-level diagram of a macrosystem including multiple base stations where each can broadcast a short-range query signal, on a relatively low frequency carrier and, when any of the portable data module receives this query signal, it can then respond, in slave mode, with a data signal at a higher frequency.

Portable Wireless Data Module

The portable data module 120 provides a miniature transportable electronic memory, together with a self contained transmitter, receiver, and power supply, which provides wireless data communication, via a base station 110, with a host computer system. The small, lightweight construction makes the device suitable for carrying in a pocket or for direct attachment to any mobile object (See FIG. 3).

Figure 8:
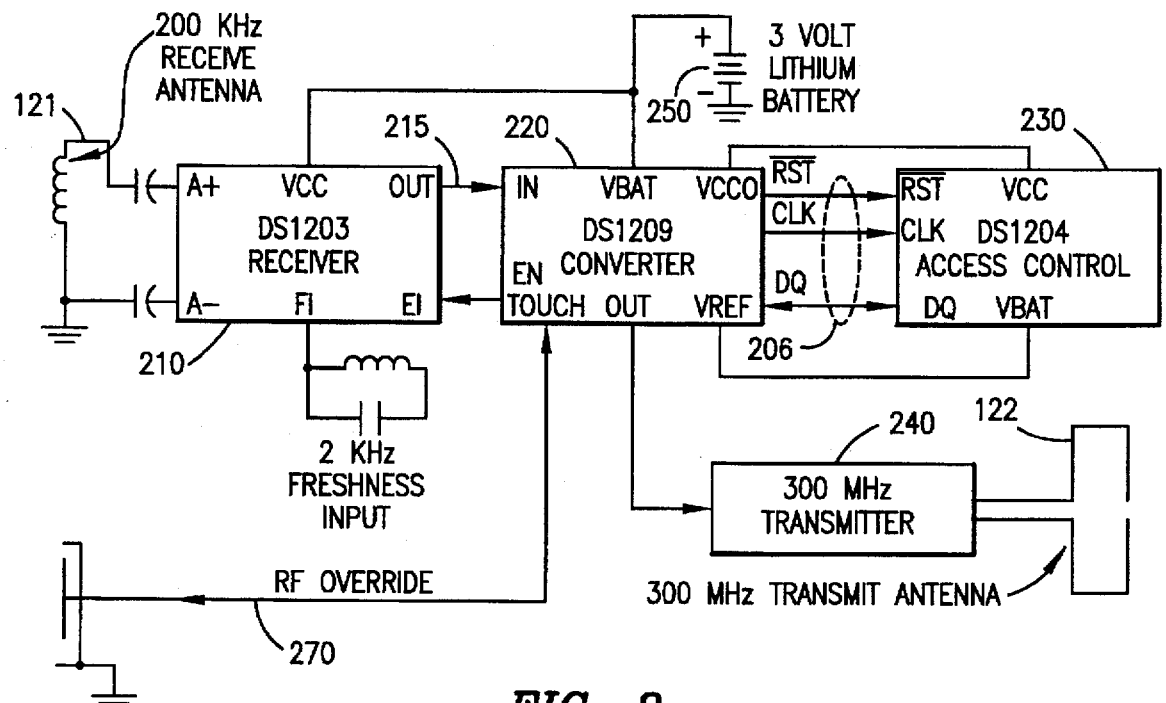
FIG. 8 is a more detailed circuit block diagram of a preferred embodiment.

FIG. 8 shows an overview of the remote module 120. The RF receiver functions are segregated on a receiver chip 210. No decoding is performed by the receiver ship 210. Decoding and encoding are performed by a converter chip 220, which also controls the serial data bus 206 within the remote module 120. The receiver chip 210 receives an RF signal (from an antenna tuned to the write-data frequency), and tracks the amplitude shifts of the RF signals to output a burst of pulses (at full digital logic levels). (The duration of the digital pulse bursts at the receiver chip's output corresponds to the duration of the analog pulse seen at its input from the write-data RF channel.) Since the output of the receiver chip 210 is simply pulse bursts, the receiver chip 210 is connected to the converter chip 220 by a simple one-wire bus, with no clock or reset signals required.

The data converter chip 220 decodes the pulse bursts provided by the receiver chip 210. This converter chip translates these digital pulse bursts from the one-wire pulse-width modulation protocol to data signals on a conventional 3-wire serial data bus 206 within the portable data module 120.

The 3-wire serial data bus 206 within the portable module can be used in a variety of ways. In the presently preferred embodiment, this bus is connected to an access control chip 230 and to the converter chip 220. (In an alternative embodiment, bus 206 can be also connected to a memory controller chip, and, through the memory controller chip, to SKAMs.) In further alternative embodiments, additional micropowered integrated circuits (such as a microprocessor or display driver) can also be included in portable module 120, and connected to bus 206, if desired. Similarly, while the portable module preferably also contains access control logic, to provide security against unauthorized access (e.g. implemented as access control chip 230), this can be omitted if desired.

To further conserve power, the portable module 120 has the capability to be completely turned off or on, by wireless control. When the receiver circuits are turned off, the power consumption is essentially zero. By keeping the receiver circuits turned off until the module is put into service, the battery life is conserved. In the off state (which is referred to as the "sleep" or "freshness seal" mode, as distinguished from the standbymode), the battery drain is reduced to transistor leakage currents—almost zero power (a few nanoamps). To put the module into service, the whole module 120 is placed in a strong 2 kHz electromagnetic field. A strong coded signal at this frequency is detected by zero-standby-power circuits in the receiver chip 210, which control logic to turn on or turn off all the other detection functions of the receiver.

The variable-duration pulses received on the write-data channel, and converted by the receiver chip 210 into variable-length bursts of digital pulses on the one-wire connection to converter chip 220, are decoded by the converter chip 220 into one of the set of possible symbols (commands). In the presently preferred embodiment, the possible command set includes:

A. Write 0 or read when active;

B. Write 1 when active;

C. Activate Reset;

D. Beacon path;

E. Return to standby.

(Even if the portable module 120 does not receive a Return-to-standby command, it will automatically return to the idle mode to conserve power after a 2 ms quiet period.) However, it should be understood that a variety of other command sets could be used instead.

These commands are interpreted by the converted chip 220 to control the three-wire serial bus 206. This bus, as is conventional, includes one line reserved for clock signals, one bidirectional data line, and one line reserved for Reset signals. Such a bus can readily be connected to serial-port memory chips, or to port pins on a DS5000 or on other micro controllers A touch-contact port 270 is also provided. Signals received at this port will override signals received from the antenna 121 which receives signals on the write-data frequency. Preferably this input is connected directly to the converter chip 220, so that antenna 121 and receiver chip 210 are bypassed if this input is used. In the presently preferred embodiment, the touch contact port 270 transfers data using a carrier frequency of 100 kHz.

The port 270 provides a backup interface mode, which can be used to supplement the RF interface in (e.g.) high noise environments, or when the battery of the portable module 120 is weak. The capability to handle a 100 kHz interface also provides useful versatility, since the module can be reconfigured fairly easily to (for example) provide capability for both 100 kHz and 200 kHz RF links.

An advantage of the encoding used on the write-data channel is that it is relatively insensitive to frequency. For example, when data is being transferred over the touch-contact port 270, the exact same coding can be used as would be used for transfer over the write-data channel. The data rate will be lower, because the frequency is lower, but the state-machine decoder circuits in the converter chip 220 can still operate in the same way. Similarly, the frequency assigned to the write-data channel can easily be changed, simply by changing or varying the reactive elements in the turned circuits, but the coding scheme will still provide a good balance of data rate with noise immunity at whatever frequency is being used.

The variable-duration pulses sent by the base station 110 at the write-data frequency (200 kHz) are picked up by the write-data receive antenna 121, and are thereby seen at the comparator input terminals (A+ and A−) of the receiver chip 210. Unless the receiver chip 210 is in freshness seal mode (as described below), the receiver chip 210 will amplify the analog input pulse signals from as low as 10 mV to provide full digital level pulse-burst signals at the output pin. The receiver chip 210 does not demodulate the RF input signal, but simply amplifies its instantaneous level. Thus, the carrier is a component of the amplified digital signal, so that what is sent to the converter chip 220 is not merely a series of variable-length pulses, but a series of variable-length bursts of constant-length pulses.

In the presently preferred embodiment, two parallel tuned antenna circuits 121 are used for reception the write-data (200 kHz or equivalent) frequency, and each of the antenna circuits is separately connected to an open loop comparator.

In alternative embodiments, the tuned antenna circuit 121 at the write-data frequency is also coupled to a tuned tank circuit, and/or to a notch filter centered at half the pass frequency, to provide sharper passband characteristics.

A tuned circuit with a discrete inductance is used to receive signals at the freshness seal frequency, but not other antenna is used. (Thus, the effective antenna cross-section at this frequency is very small. This is acceptable because the freshness seal only needs to detect very strong signals.) The input to the freshness-seal-signal detection circuits is labeled as signal "FT".

The converter chip 220 is basically a state machine, which controls the serial bus 206 and determines what action is to be taken by the attached access control chip 230. The access control chip 230 receives signals from the converter chip 220 over the bus 206. These signals either write data into or read data out of the access control chip 230. The access control chip 230 includes specially partitioned memory space, which stores a 64 bit identification code and a 64-bit password. The password memory is combined with comparison logic, so that data accesses are screened for password match. Preferably the password memory (which, in this embodiment, includes 128 bits of read/write nonvolatile memory) cannot be read, and can be overwritten only by an access which includes a match with the existing password.

When the portable data module is receiving data to store in the access control chip 230, the converter chip 220 generates the CLK, RST* and data signals, in accordance with data received from the receiver chip 210. However, when the portable data module is being read, data is transmitted back to the base station 110 via a 300 MHz transmitter which is controlled by the converter chip 220.

The portable data module is self powered by a lithium energy cell. The unit is designed to last for over ten years. The converter chip 220 and receiver chip 210 control the energy consumption and power distribution within the module.

In addition, an access control chip 230 is connected to the data converter chip 220 by the 3-wire serial data bus 206. The access control chip 230 can receive its power supply voltage from the data converter chip 220 either over the RST* line, or (when RST* is low), over the $V_{BAT}$ input (which is connected to the reduced-voltage supply BATOUT of the converter chip 220).

Transmitter

Figure 12:
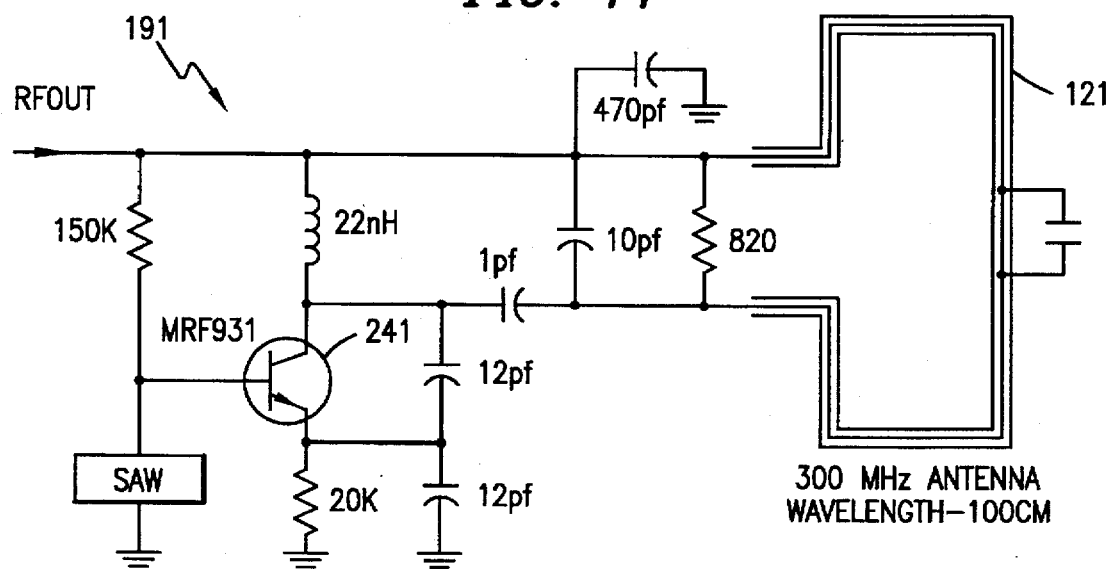
FIG. 12 is a circuit diagram of a bipolar transistor driver of a UHF output and the corresponding keying mechanism to key the driver from an RF input keys.

FIG. 12 shows details of the transmitter 191. This transmitter is powered and controlled by signal RFOUT, which is provided by the data converter chip 220. When the signal RFOUT is pulled high, transistor 241 is enabled to turn on. The transistor 241, in this example, is an NPN transistor with a cutoff frequency substantially higher than the desired transmission frequency. For example, an MRF931 has been found to be satisfactory.

The various reactances shown provide feedback, so that the transistor 241 sustains oscillation. The oscillation output is connected to read-data transmit antenna 121. Antenna 121 is preferably an etched PC board trace, tuned by a discrete capacitor to achieve resonance at the desired operating wavelength (which in this example about 100 centimeters). However, it must be understood that the circuit configuration of these reactances could be rearranged in a tremendous variety of ways. Moreover, different values can be readily substituted for the specific sample values given.

It is further contemplated that frequency stabilization, using low-loss surface-acoustic-wave (SAW) devised, will become advantageous. SAW devices with reasonably low insertion losses (close to 1 dB) are now available reasonably cheaply. Such stabilization means that the base station does not have to sweep so broad a band to detect an incoming signal.

Note that FIG. 12 shows a SAW filter used to provide a reactance from gate to ground, but a capacitor may be used instead if a lower insertion loss or lower Q is desired. Note also that the antenna is connected across the tank circuit: this has been found to be advantageous in such low-power applications.

COMMAND SET FOR INTERFACE TO SERIAL BUS

In the presently preferred embodiment, the serial bus protocol can cause the memory controller 260 to perform any of the following eight actions:

PROTOCOL COMMANDS

Figure 10:
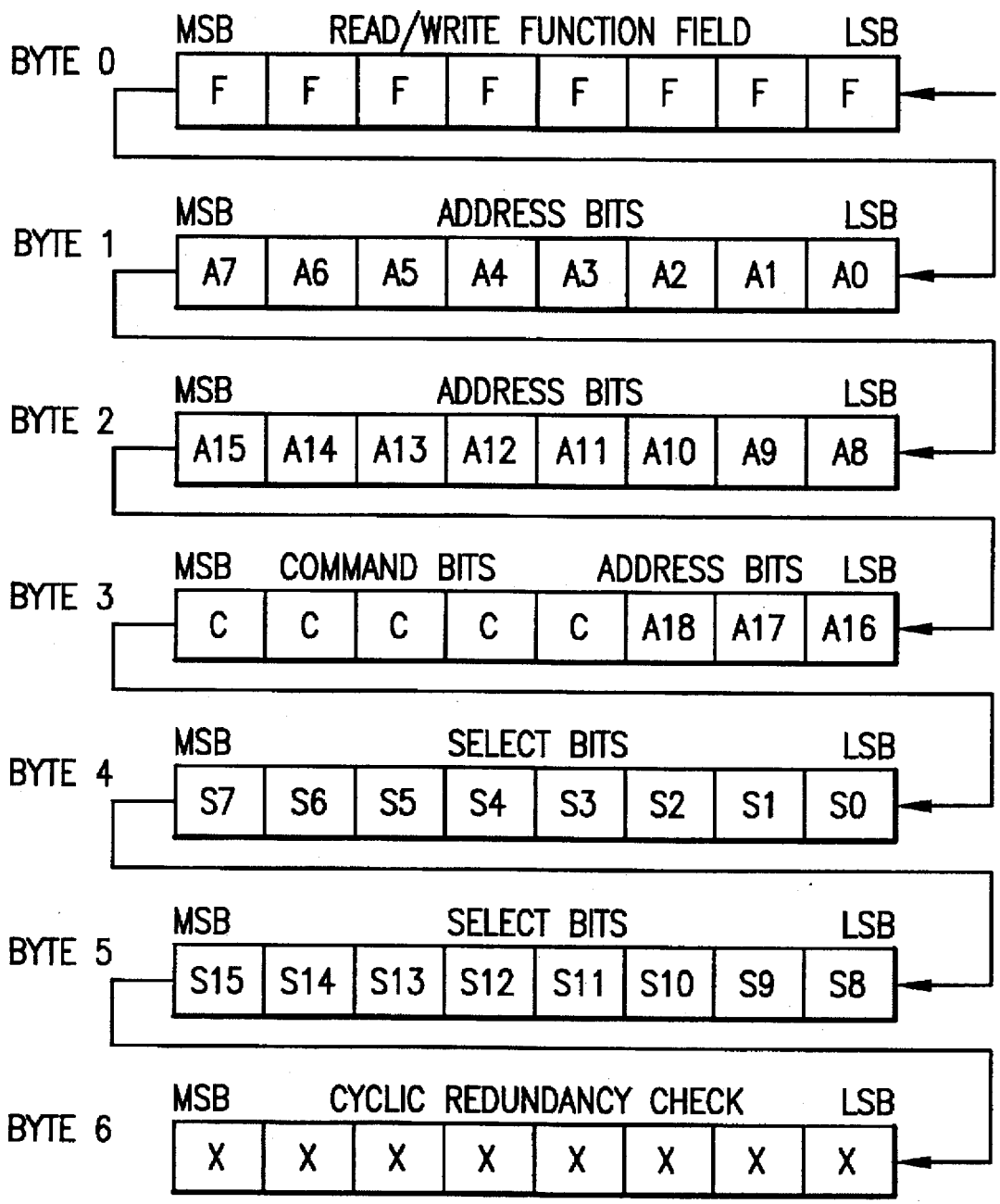

1. Burst Read
2. Burst Write
3. Read protocol select bits
4. Write protocol select bits
5. Burst read masking portions of the protocol select bits
6. Read CRC register
7. Set the address arbitration byte location
8. Poll arbitration byte for status and control The organization of the 56 bit protocol is shown in FIG. 10. As defined, the first byte of protocol determines whether the action which is to occur involves a read or write. A read function is defined by the binary pattern 11101000. This pattern, therefore, applies to commands 1, 3, 5, and 6 of Table 1. A write function is defined by the binary pattern 00010111. This pattern, therefore, applies to commands 2, 4, 7 and 8 of Table 1. Any other pattern which is entered into the read/write field will cause further action to terminate. (This provides further protection against transmission errors in the overhead bits.) Additional differentiation as to which read or write command is determined by the last five bits of the third byte of the protocol called the control field.

The control field bits, in the presently preferred embodiment, are as follows.

| | Control Field |
|---|---|
| Bits: | Command |
| 00110 | Burst read |
| 10001 | Burst write |
| 00011 | Read CRC register |
| 10110 | Set arbitration byte address to 00000 or 3FFFF |
| 01001 | Poll arbitration byte for access to RAM |
| 00101 | Read protocol select bits |
| 01110 | Write protocol select bits |
| 11XXX | Burst read masking portions of the select bits |

These commands are interpreted as follows:

A burst read uses a 19 bit address field (which includes the second and third bytes plus bits 0, 1, and 2 of the fourth byte) of the protocol to determine the starting address of information to be read from RAM. The byte of data resident in that location is loaded into the eight-bit shift register within a memory controller. The byte of data is then transferred from the shift register to the 3 wire bus by driving the DQ line on the falling edge of the next eight clocks with the LSB first.

A burst write uses the same 19 bit address field to determine the starting address of information to be written into RAM. Data is shifted from the DQ line of the 3 wire bus into an eight bit shift register within the memory controller on the next eight rising clock edges. After a byte is loaded, the data is written into the RAM location immediately after the rising edge of the eighth clock.

Burst reads and writes will continue on a byte by byte basis, automatically incrementing the selected address by one location for each successive byte. Termination of a current operation will occur at any time when RST* is taken low. However, once a byte of data has been loaded into the shift register, the ongoing write cycle will be allowed to finish, even if RST* goes low during RAM write. This prevents corrupted data from being written into the RAM. If a full byte of data has not been loaded into the shift register when RST* goes low, no writing occurs. Reads can be terminated at any point, since there is no potential for corruption of data.

The read CRC command provides a method for checking the integrity of data sent over the 3 wire bus. The CRC byte resides in the last byte (Byte 6) of the protocol. The eight bit CRC byte not only operates on the protocol bits as they are written in, but also on all data that is written or read from RAM. After a burst read or write has finished and RST* has gone low, the final value of the CRC is stored in the memory controller. If a read CRC register command is issued, the stored CRC value is driven onto the D/Q line by the first eight clock cycles after the protocol is received. The CRC value generated by the memory controller should match exactly with the value generated in the host system which is transmitting or receiving data on the other end of the 3 wire bus. If it does not, data has been corrupted and retransmission should occur.

It should be noted that the CRC for a previous transaction can only be obtained if a read CRC command is issued immediately after RST* goes low to reset the memory controller, then high to accept a read CRC command. If any other sequence is followed, an intermediate CRC will be generated and stored whenever RST* goes low again, destroying the CRC value of interest.

In any two port system there is a potential for access collisions. To solve this problem, an arbitration byte is provided so that the serial and parallel ports of the memory controller can determine the status of the other port. A special byte in RAM address space is reserved to allow for handshaking between the two ports. This arbitration byte has a special attribute in that it is simultaneously accessible by both ports. Two commands are used by the 3 wire serial port protocol to manage the arbitration byte. First, since this byte will create a hole in RAM address space for the parallel byte wide port, a command is added to move the arbitration byte to either address location "00000" or address location "3FFFF". When setting the arbitration byte address location, the correct read/write field and command field must be entered, along with a value for bit A0 of the address field. (A 0 moves the arbitration byte to 00000, and a 1 moves it to 3FFFF .) It is important to note that the arbitration byte is located in the parallel memory location assigned by the serial port using the appropriate commands. However, the physical byte of RAM is located within the memory controller. The existence of this physical byte is transparent to the bytewide parallel port and looks like normal RAM space with some write restriction. However, the serial port can still address the actual RAM location at either 00000 or 3FFFF in addition to accessing the arbitration byte. The second command used by the 3 wire serial port provides for polling of the arbitration byte to determine the status of the parallel port. In addition, the arbitration byte can be set to indicate to the parallel port at the serial port is taking over the RAM.

The second command protocol allows the serial port to do a compressed read-write-read operation, which causes the arbitration byte to be read by the first eight clocks following the protocol. The next eight clocks cause data to be written into the arbitration byte, and the last eight clock cycles allow for a second read of the data for verification. These 24 cycles are initiated by entering the 56 bit protocol only once. The protocol pattern entered is a write function in the read/write field (00010111), and the correct control field.

Two other commands are used to access the select bits in the protocol. Once the select bits are set to binary values, they must be matched exactly when protocol is sent by further activity is prevented. The bits allow for 65,536 different binary combinations. Therefore, many memory controllers can be connected on the same serial bus, and only the appropriate device will respond. To write the select bits, a write cycle in the read/write field is required along with the appropriate command in the command field. To read the select bits, a read cycle in the read/write field is required along with the appropriate command in the command field. The arrangement of reading and writing select bits allows the user to have a large number of memory controllers in use and uniquely identify each. A read can occur successfully without knowing the select bits but a write cannot occur without matching the current select field.

A third command, masking specific select bits, provides a means for determining the identity of specific memory controllers in the presence of many memory controllers. A read in the read/write field and a "11000" in the command field will execute a burst (masked) read. This operation ignores all select bits, to permit a base station 110 to quickly determine the presence of any memory controllers. With the detection of at least one device, a search can begin by masking all but a single pair of memory controller select bits. A read in the read/write field and a "11001" in the command field will unmask the first two LSBs of byte 4 of the select bits. With these two select bits unmasked, only an exact match of four possible combinations (00, 01, 10, 11) of these two select bits will now allow access through the 3 wire port to RAM. Therefore, repeating the unmasking of the first two bits of the select field up to four times will give the binary value of these select bits. Having determined the first two select bits, the next two select bits can be unmasked, and the process of matching one of four combinations can proceed as before. In fact, repetition of unmasking select bit pairs will yield an exact match of 65,536 possible memory controllers in no more than 32 attempts.

Arbitration

As mentioned earlier, one byte of RAM has been reserved for arbitration between the 3 wire port and the bytewide parallel bus. The location of this byte within the memory map will be at address 00000 or at address 3FFFF (as determined by the protocol input from the 3 wire serial port).

Figure 9:
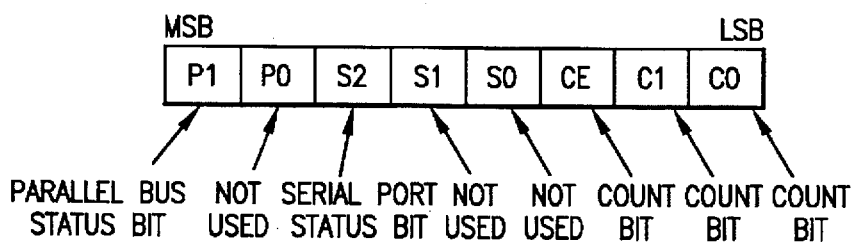
FIGS. 9 and 10 are diagrams of preferred embodiments of command bits.

The arbitration byte has special restrictions and disciplines so that the 3 wire serial bus and the bytewide parallel bus are never in contention for RAM access. The format of this byte, in the presently preferred embodiment, is shown in FIG. 9. In this embodiment, the serial port 705 can read the whole arbitration byte, but can only write bits S2–S0. The parallel port 701 can read the whole byte, but can only write bits P1–P0. An internal counter controls count bits C2–C0, which cannot be written by either port.

To access memory, in this scheme, the ports read the status bits, and write the bits over which they have control. If the serial port wants to access RAM, it polls the arbitration byte until bit P1 equals zero (indicating that the parallel port is not engaged in access). When P1 equals zero, the serial port then writes a one into bit S2. After writing bit S2, the serial port then reads the arbitration byte again, to confirm that P1=0 and S2=1. This operation must be executed with the protocol for the compressed read-write-read sequence which minimizes overhead. The 3 wire serial port should always abort any attempt to access RAM if P1 equals one. When the 3 wire serial port completes any transfer of data to or from RAM, Bit S2 should be written back to zero so that the bytewide parallel port will know that the 3 wire serial port is not using the RAM. The bytewide serial bus can gain access to RAM by polling the arbitration byte until S2 bit equals zero. When S2 equals zero, the bytewide parallel port then writes a one into bit P1. A read cycle verifying that S2 equals zero and P1 equals one confirms that the bytewide parallel port has access to RAM. The bytewide parallel port can then read or write RAM as required. When the entire transaction is complete, the bytewide parallel port should write the P1 bit to zero, signaling the 3 wire serial port that the RAM is not in use. The bits B0, S1, and S0 can be defined by the user definition to pass additional arbitration information making possible more elaborate handshaking schemes between two ports. Some typical uses for these bits could be an indication that a port desires access to RAM, or the amount of RAM.

An alternative method of arbitration can also be followed. In this alternative method, arbitration is accomplished by use of the count bits C0–C2. Due to the overhead protocol used for access on the serial bus 705, the serial port cannot read or write from RAM more often than once in every eight clock cycles. Moreover, the internal counter (which is updated whenever another byte is loaded into the internal serial buffer) is organized so that it is certain that serial port accesses will only occur when the counter transitions from a "111" state to a "000" state. The serial port has access on these clock cycles, and the parallel port has access at all other times, regardless of the arbitration byte status bits. Since the 3 wire port always reads or writes at the ends of a byte (when bits C0–C2 are all equal to 1), the software which controls the bytewide parallel bus is never allowed to access the bytewide RAM bus at these times (when the count bits are all ones). The parallel port can determine the minimum time left before the 3 wire serial port will access the memory, by reading the count bits and the minimum clock cycle applied to the 3 wire clock input. Essentially the 3 wire serial port is given priority on access to RAM, and the bytewide parallel port determines when it can access the RAM to avoid colliding with the 3 wire serial port.

Touch-Contact Interface

Figure 4:
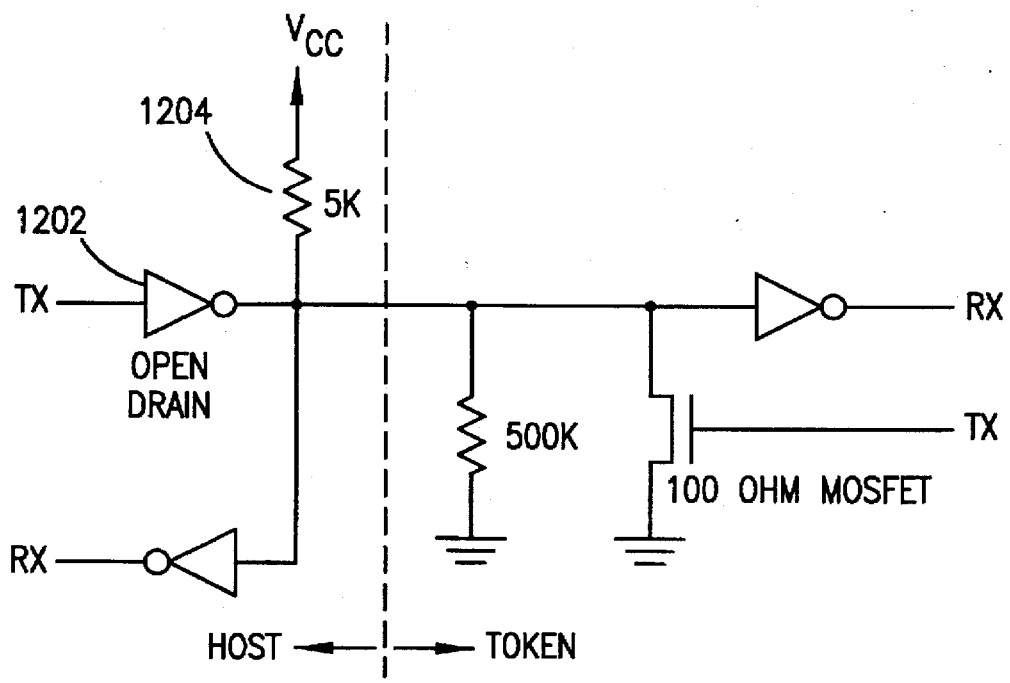
FIG. 4 is a schematic diagram of the electrical relations of the touch contact port on the data module of the presently preferred embodiment.

FIG. 4 is a schematic diagram of the electrical relations of the touch contact port on the data module of the presently preferred embodiment.

Figure 5A:
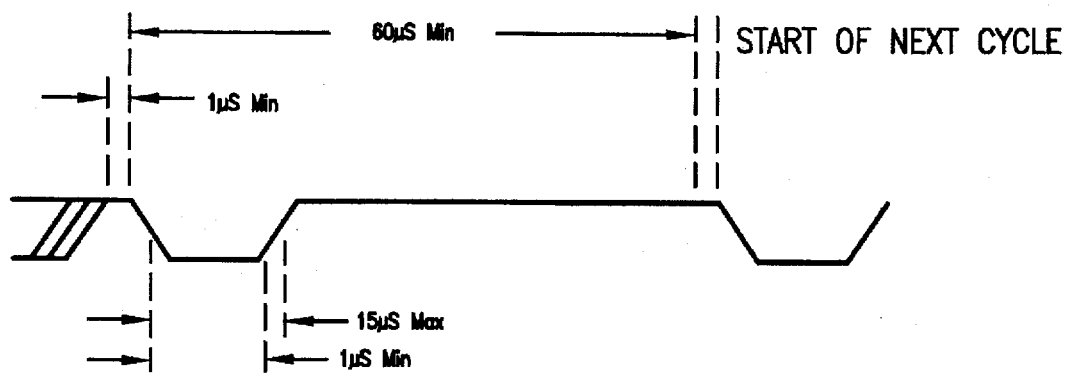
FIGS. 5A, 5B, and 5C show the timing relations used, in the presently preferred embodiment, for read and write operations through the touch contact port on the data module of the presently preferred embodiment.
Figure 5B:
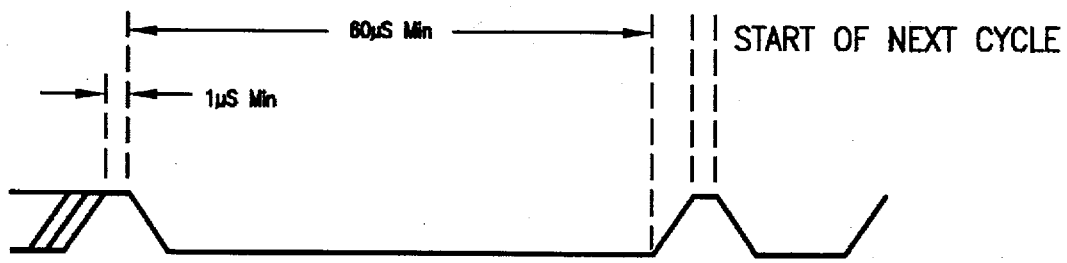
Figure 5C:
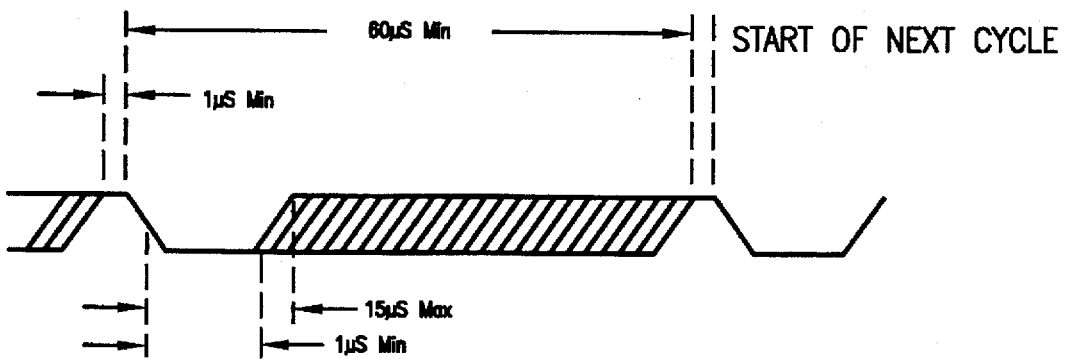

FIGS. 5A, 5B, and 5C show the timing relations used, in the presently preferred embodiment, for read and write operations through the touch contact port on the data module of the presently preferred embodiment.

Electrical Interface from Host System

The host system must have an open drain driver with a pull-up resistor of approximately 5 Kilohoms to $V_{CC}$ on the Data signal line. The token has internally an open drain driver with a 500 Kilohom pulldown resistor to ground. The open drain driver allows the token to be powered by its small internal energy source and still have the ability to produce sufficiently large voltage swings at the outputs. The pull-down resistor holds the Data input pin at ground potential when the token is not connected to the host.

Read/Write Timing

The timing relationships used in the one-wire interface used at touch interface 171, in the presently preferred embodiment, will now be described.

There are two types of write data time slots, Write One Time Slots and Write Zero Time Slots. A write data time slot is initiated when the host pulls the Data line from a high logic level to a low logic level. All write data time slots must be a minimum of 60 microseconds in duration with a minimum of 1 micro-second recovery time between write cycles. In this example, the crude time base in the module provides a 4:1 range in the possible time durations: timing relations are defined with respect to a one-shot in the module which will provide a pulse width of at least 15 microseconds (but not more than 60 microseconds).

This one-shot is preferably trimmable, to a wide variety of speed ranges. Moreover, other circuit arrangements could be used instead, to generate a timing base. Thus, in the following example, the timing window of 15–60 microseconds does not delimit the claimed inventions, but merely serves to illustrate how the innovative one-wire bus protocol can cope with timing uncertainty. The same principles of operation could be used if the modules were trimmed to have varying time delays within the range of (for example) 1–4 microseconds.

FIG. 5A is a timing diagram of a write-1 operation, in the module of the presently preferred embodiment. For the host to perform a Write-1 operation, the following steps occur:

1. The Data line is held at a high level for at least one microsecond. This ensures that the edge detector in the module will have sufficient set-up time.
2. The Data line is pulled to a logic low level. This provides the falling edge which the module uses to time its operations from.
3. The Data line is then held low for at least one microsecond, to ensure that the falling edge is detected by the module.
4. After the falling edge, the Data line must be driven high within 15 microseconds, and held high for at least 60 microseconds (from the time of the falling edge in Step 2). This ensures that the Data line will be high when the pulse generated by the one-shot in the module ends. When the pulse ends (producing a falling edge), the module will sample the logic level of the data line, to determine whether a 0 or a 1 is the data value.

Steps 1–4 can then be repeated, to write the next bit.

FIG. 5B is a timing diagram of a write-0 operation, in the module of the presently preferred embodiment. The steps in this operation are the same as the steps in a Write-1 operation, except that, in step 4, the Data line is held low during the window of 15–60 microseconds after the falling edge. This ensures that the Data line will be low at the end of the pulse generated by the one-shot in the module.

FIG. 5C is a timing diagram of a read operation, in the module of the presently preferred embodiment. When data is to be read from the token by the host, the host will generate the read data time slots. A read data time slot is initiated (as in steps 1–3 of the write-1 operation) when the host pulls the Data line from a logic high level to a logic low level. As soon as the module sees this falling edge, it will conditionally turn on its pull-down transistor (depending on the value of the data bit being read), and will leave the pull-down transistor turned on (conditionally) until the end of the pulse generated by the one-shot. Thus, during a read operation, after the falling edge (and the following guard time), the host waits for enough time for the data line to have been pulled up to a high level (if the module is not holding it down), and then samples the data line. In the presently preferred embodiment, where the host port has a 5 Kilohm pull-up resistor, the host preferably tests the data line 10 microseconds after the falling edge. From 15 to 60 microseconds after the falling edge, the state of the data line is uncertain, since it is not known whether the module has yet timed out and released the data line. All read data time slots must be a minimum of 60 micro-seconds in duration, with a minimum of 1 micro-second recovery time between read cycles.

The module's time base varies widely between parts, and may also be quite dependent on temperature (which will typically vary the battery voltage). However, the module's time base will not vary as widely from moment to moment. Thus, in a less-preferred alternative embodiment, the host can measure the time base of the module (by performing more frequent samplings during a read operation), and maximize the data rate for the particular module being read. However, this is not preferred, since the most preferred system embodiment will typically have only brief exchanges (one read, or one read plus one write) in each contact of a host with a particular module.

Details of Touch Interface Circuitry 171

The operation of the touch interface circuitry 171 is planned to be the same as the DS1281 3-Wire to 1-Wire Converter chip. Although this chip is not included in the module, as presently contemplated, it will be described in detail to clarify the contemplated best mode of operation of the port 171. However, it must be recognized that not all of the described features of the DS1281 chip need necessarily appear in the circuitry of port 171.

The DS1281 3-Wire to 1-Wire Converter is used to connect a 3-wire, data, clock and RST/, serial device to a 1-wire "touch" interface. Each DS1281 is manufactured with a unique 48-bit serial number which can be read through the 1-wire "touch" interface. In addition, there is an 8-bit Type Identifier Code which can be read through the 1-wire interface. An internal state machine provides an arbitration mechanism for operation with an existing 3-Wire serial port on a first-come first-served basis. Low power CMOS circuitry design allows operation of the part in battery backup and battery operate environments.

Some significant features of this embodiment (not all of which are necessarily asserted to be inventive) include the following:

Adapts a 3-Wire device to a 1-Wire "TOUCH" interface
Contains a unique factory lasered serial number
Contains an 8-bit type identifier code to simplify protocol identification
Provides arbitration mechanisms for dual port operation
CMOS circuitry design for battery operate applications
Space saving 10-pin SOIC Package

Operation

When the 1-Wire "TOUCH" interface is used, all communications to and from the DS1281 are accomplished via a single interface lead. Data is read and written through the use of time slots to manipulate bits and a command word to specify the transaction.

Write Time Slots

A write time slot is initiated when the host pulls the data line from a high logic level to a low logic level. There are two types of write time slots: Write One time slots and Write Zero time slots. All write time slots must be a minimum of 60 microseconds and a maximum of 120 microseconds in duration. There is a minimum of a 1 microsecond valid access recovery time between time slots.

For the host to generate a Write One time slot, the data line must be pulled to a logic low level and then released, allowing the data line to pull up to a high level within 15 microseconds after the start of the write time slot.

For the host to generate a Write Zero time slot, the data line must be pulled to a logic low level and remain low for the duration of the write time slot.

Read Time Slots

The host generates read time slots when data is to be read from the 1-Wire interface. A read time slot is initiated when the host pulls the data line from a logic high level to a logic low level. The data line must remain at a low logic level for a minimum of one microsecond and a maximum of 15 microseconds. This maximum time of 15 microseconds includes the time required for the data line to pull up to a high level after it is released. The state of the 1-Wire data line must be read by the host within 15 microseconds after the start of the read time slot. After this time, the state of the data is not guaranteed. All read time slots must be a minimum of 60 microseconds in duration with a minimum of a one microsecond valid access recovery time between individual read time slots.

1-wire Protocol

The 1-Wire protocol can be viewed as having three distinct layers. These layers are the Presence Detect layer, the Reset layer, and the Command layer.

Presence Detect

The presence detect layer is used to signal to a host device that a new device has been attached to the 1-Wire port. The 1-Wire port from the host remains at a logic high level during quiescent times between read and write time slots. This high time must be present for a minimum of 15 microseconds before the new device can assert a presence detect signal. The presence detect signal will be a logic low level asserted by the newly attached device which remain low for a maximum of 240 microseconds and then released. (FIG. 25 shows a timing diagram of the presence detect operation.) This low logic level can be detected by the host and used as an interrupt condition for the host processor.

Device Reset

The reset layer is used to reset the attached 1-Wire devices. This allows the host to place the 1-Wire device or devices into a known state at any time. The reset signal consists of a logic low level asserted by the host for a minimum of 480 microseconds. After which, the host must release the 1-Wire signal line and allow it to rise to a logic high level. This high logic level must be maintained by the host for a minimum of 480 microseconds before any data can be exchanged. During this logic high time, any device present on the 1-Wire signal line will assert its presence detect waveform.

1-wire Commands

There are four commands which can be issued by the host on the 1-Wire port. These are:
1) [$33_H$] read ROM data
2) [$55_H$] match ROM data
3) [$F0_H$] search ROM data
4) [$CC_H$] pass through mode.

Read ROM Data

Upon recognition of the command word [$33_H$], the DS1281 is ready to respond to the next eight read time slots with the Type Identifier number. This number is a hexadecimal 3 ($03_H$) and is unique to the DS1281 part.

After receipt by the host of the Type Identifier number, the DS1281 is ready to output the unique 48 bit serial number contained within the device. The host must issue 48 read time slots to retrieve this number. Following the 48 bit serial number is an eight bit Cyclic Redundancy Check value. This CRC value has been calculated over the Type Identifier and Serial Number, 56 bits total, using the following polynomial:

$$px=x2+x3, \text{ assuming } x0\Rightarrow Lsb$$

This calculated value is complemented and the lasered into the pan at the time of manufacture. To read the CRC value, the host must issue eight additional read time slots.

Match ROM Data

The match ROM data command is used as a device select when multiple 1-Wire devices are connected to a single bus. This command allows the host to address any one of the multiple 1-Wire devices on an individual basis. To do a match ROM data command, the host must issue the command, [$55_H$], to the device with eight write time slots. Following the command byte, the host must write the desired devices' Type Identifier, Serial Number, and CRC byte. If all of these values match the data stored internally in the ROM, the DS1281 can now be accessed using the standard DS1281 commands and protocol. If any of the bit values transmitted by the host fail to match the ROM data pattern, the access will be terminated. To return from a pattern fail condition, the host must issue a Reset command, including Type ID, 48 bit serial number, and CRC value.

Search ROM Data

The search ROM data command, [$0F_H$], allows the host 1-Wire device to poll efficiently to determine the unique ROM address of all devices on the 1-Wire bus. In this mode, each of the bits of the ROM data requires three time slots on the 1-Wire bus. The first two time slots are read time slots in which the DS1281 transmits back to the host the value of the ROM bit followed by its complement. The third time slot is a write time slot in which the host supplies its desired value for the ROM bit. The DS1281 then compares the desired value with the actual ROM bit. If they disagree, the DS1281 will hold the 1-Wire signal line at a logic high level for a minimum of 1 millisecond and then allow it to revert to its initial state. If the bits agree, the DS1281 increments its internal counter to point to the next bit in the ROM data and then repeats the same set of three time slots for the next bit. If all bits of the ROM are matched correctly, the host may access the DS1281 with the standard command structure for the part.

Example of a ROM Search

The following example of the ROM search process assumes four different DS1281 are connected to the same 1-Wire bus. The ROM data of the four DS1281s begins as shown:

| ROM0 | 00110101... |
|------|-------------|
| ROM1 | 10101010... |
| ROM2 | 11110101... |
| ROM4 | 00010001... |

The search processes is as follows:

1) The host begins by Resetting all devices present on the 1-Wire bus.
After this, the host will attempt to read the Type Identifier, Serial Number, and CRC value for the part.

2) The host will then issue then SEARCH ROM DATA command on the 1-Wire bus by writing [F0$_H$].

3) The host executes two read time slots and receives two zero bits. This indicates that both one bits and zero bits exist as the first bit of the devices on the bus.

4) The host supplies a write zero time slot as the third time slot. This deselects ROM1 and ROM2 for the remainder of this search pass, leaving only ROM0 and ROM3 connected to the 1-Wire bus.

5) The host executes two read time slots and receives a zero bit followed by a one bit. This indicates that all devices still coupled to the 1-Wire bus have zeros as their second ROM data bit.

6) The host supplies a write zero time slot as the third time slot to keep ROM0 and ROM3 coupled.

7) The host executes two read time slots and receives two zero bits. This indicates that both one bits and zero bits exist as the third bit of the ROM data of the attached devices.

8) The host supplies a write zero time slot as the third time slot. This deselects ROM0 leaving ROM3 as the only device connected.

9) The host reads the remainder of the ROM data bits for ROM3 and continues to access the part if desired. This completes the first ROM search pass and has identified one part uniquely on the 1-Wire bus.

At this point, the host repeats the process described above to determine the addresses of the remaining devices on the 1-Wire bus by repeating steps 1 through 7.

Note should be made of the following points in relation to the example described previously:

The host learns the unique address (ROM data pattern), of one 1-Wire device on each ROM SEARCH operation. The time required to derive the part's unique address is:

$$960\ \mu s + [8 + (3 \cdot 64)] \cdot 60\ \mu s = 12.96\ \text{milliseconds}$$

The host is therefore capable of identifying 75 different 1-Wire devices per second.

Additionally, the data obtained from the two read time slots of each set of three time slots have the following interpretations:

00—there are still devices attached which have conflicting bits in this position.
01—all devices still coupled have a zero bit in this bit position.
10—all devices still coupled have a one bit in this bit position.
11—there are no devices attached to the 1-Wire bus. (This is an error condition.)

Pass-thru Mode

The pass-thru command is used to allow a host connected to the 1-Wire bus to gain access to the 3-wire device connected to the DS1281. It is entered by issuing 8 write time slots of [CC$_H$] to the DS1281. This command bypasses the serial number internal to the DS1281 and allows the host to directly control the attached 3-wire device.

3-wire Bus

The 3-Wire bus is comprised of three signals. These are the RST/(reset) signal, the CLK (clock) signal, and the DQ (data) signal. All data transfers are initiated by driving the RST/input high. The RST/signal provides a method of terminating a data transfer.

A clock cycle is a sequence of a following edge followed by a rising edge. For data inputs, the data must be valid during the rising edge of a clock cycle. Command bits and data bits are input on the rising edge of the clock and data bits are output on the falling edge of the clock. All data transfers terminate if the RST/ is low and the DQ pin goes to a high impedance state. When data transfers to the DS1281 are terminated by the RST/ signal going low, the transition of the RST/ going low must occur during a high level of the CLK signal. Failure to ensure that the CLK signal is high will result in the corruption of the last bit transferred.

1-wire/3-wire Arbitration

The DS1281 can utilize both the 1-Wire and the 3-Wire busses simultaneously. Neither input bus has priority over the other. Instead, if both inputs are being used, the signal arriving first will take precedence. More simply, if the 1-Wire interface becomes active before the 3-Wire interface, all communications will take place on the 1-Wire bus. The 3-Wire bus will be ignored in this case. The same condition occurs for the 1-Wire interface if the 3-Wire interface becomes active first.

Overall Description of Sample Embodiment

A specific product embodiment will now be described in great detail. This embodiment (referred to by part number "DS2469". However, it must be understood that the very specific features of this embodiment are described merely by way of example, and do not necessarily delimit the claimed invention.

The DS2469 is a 512 bit serial memory intended for RF identification applications. The memory may be configured as a single 512 bit partition or as four 128 bit partitions. The length of each partition may be specified to any value less than the maximum. Data is clocked out of the first partition onto the RFOUT1 pin using the low-level, differential clock inputs, M+ and M−. The other three partitions clock data out with an internally generated clock onto the RFOUT2 pin when the proper levels are presented to PB0, PB1 or PB2. The configuration options, as well as the memory data, are set through a single line interface, which may also be used to verify the configuration settings and the data.

Operation

The major features of the operation of the preferred embodiment will now be described in detail.

Wireless Read

If the DS2469 is configured as a single partition, the data is clocked out onto the RFOUT pin using the low-level differential clock inputs, M+ and M−. A data change occurs on every Nth postive transition of M+ relative to M−. The value of N is user defined and may be any integer value from 1 to 512. The device will cycle through the partition four times and then will pause for a pseudo-random number (4 to 11) of partition cycles before restarting the data output. This arbitrary timeout allows multiple devices to be read even though they are both in close proximity to each other. If the device receives a total number of clocks exceeding 32768 then data output is terminated until no differential clock signal is received for a period of 50 mS. The minimum differential clock signal is 15 mV, in the presently preferred embodiment, and the maximum differential clock frequency is 490 KHz. When the DS2469 is configured to have four memory partitions the data for each partition is clocked according to the following table.

| PB2 | PB1 | PB0 | Partition | CLOCK SOURCE | OUTPUT |
|---|---|---|---|---|---|
| 0 | 0 | 0 | 0 | M+,M− | RFOUT1 |
| X | X | 1 | 1 | INTERNAL | RFOUT2 |
| X | 1 | 0 | 2 | INTERNAL | RFOUT2 |
| 1 | 0 | 0 | 3 | INTERNAL | RFOUT2 |

The internally generated clock which is used to output data from the upper three partitions has a user selectable frequency of 150 Hz to 19200 Hz in successively doubled values. Data will be output from the upper three partitions (according to the state of PB0, PB1 and PB2) until the appropriate partition has been read 16 times.

Touch Interface Operations

The DS2469 has available a one-wire communication port through which the memory may be written or read and the configuration options can be set and verified. This port uses a time-slotting technique for communication. In this technique a host system drives the input pin to a low state for varying periods of time to send a logic 0, a logic 1, a reset signal or to the DS2469 or to receive data from the DS2469. All operations through this port are preceded by the logic and timing operations as described above. Once the one-wire interface protocol has been satisfied, communications with the memory are initiated by sending a 24 bit command word to the DS2469.

Command Word

The command word is a 24 bit sequence of logic 0's and 1's which specify the operation to be performed by the device. There are six possible operations; Read Data, Write Data, Lock Data Set Configuration, Verify Configuration or Lock Configuration. The bit sequences are detailed in Table 2.

TABLE 2

| COMMAND WORDS | | | |
|---|---|---|---|
| COMMAND | UPPER | MIDDLE | LOWER |
| READ DATA | AA | AA | A3 |
| WRITE DATA | AA | AA | 5C |
| LOCK DATA | AA | AA | 52 |
| READ CONFIG | AA | AA | AC |
| WRITE CONFIG | AA | AA | 53 |
| LOCK CONFIG | AA | AA | 50 |

Read Data

If the command word issued to the DS2469 specifies a Read Data operation, then the device will output the entire 512 bit memory in a serial fashion. A single read cycle consists of the host driving the input pin from a high to low state, holding it there for a period of 1 μsec, and then releasing the pin so the pan may drive data onto it. If a logic zero is being driven the low state will be retained on the pin for 60 μsec after the falling edge was input. A logic 1 will return the pin to high state in a period of time after release determined by the external pullup resistor (typically, about 2 μsec).

Write Data

The Write Data command allows the entire 512 bit data memory to be written in a serial fashion. The data is input after the command word using the same convention for sending logic 0's and 1's as the command word.

Lock Data

Once issued, the Lock Data command prevents any further Write Data operations to the memory. This command is a one-time-only command, and its effect cannot be reversed unless the power supply is removed from the part and reattached.

Set Configuration

The Set Configuration allows those registers which determine the user defined options to be set. The data is written to all registers serially according to FIGS. 7b–7d.

Verify Configuration

The Verify Configuration command allows the configuration registers to be read in serial fashion in the same manner as the Read Data operation. Refer to FIGS. 7b–7d for the specific bit locations.

Lock Configuration

Once issued, the Lock Configuration command prevents any further modification of the configuration registers. This command is a one-time-only command, and its effect cannot be reversed unless the power supply is removed and reattached.

TABLE 3

| CONTRIBUTION REGISTER | |
|---|---|
| BIT(DEC) | PURPOSE |
| 00 | PARTITIONED/CONTIGUOUS MEMORY |
| 01–09 | PARTITION 0 LENGTH (BIT09 = MSB) |
| 10–16 | PARTITION 1 LENGTH (BIT16 = MSB) |
| 17–23 | PARTITION 2 LENGTH (BIT23 = MSB) |
| 24–30 | PARTITION 3 LENGTH (BIT30 = MSB) |
| 31–33 | PB BAUD RATE MULTIPLIER (BIT33 = MSB) |
| 34–43 | DIFFERENTIAL CLOCK DIVIDER (BIT43 = MSB) |
| 44 | FRESHNESS SEAL |

Further Modifications and Variations

It will be recognized by those skilled in the art that the innovative concepts disclosed in the present application can be applied in a wide variety of contexts. Moreover, the preferred implementation can be modified in a tremendous variety of ways. Accordingly, it should be understood that the modifications and variations suggested below and above are merely illustrative. These examples may help to show some of the scope of the inventive concepts, but these examples do not nearly exhaust the full scope of variations in the disclosed novel concepts.

It should be noted that the operating modes described do not have to be used alone, but can be mixed with other modes of operation. For example, it may be useful to have a base station which sends a pure sine wave query at some times, and sends a coded interrogation at others; or it may be advantageous to encode a very small amount of data onto the low-frequency carrier, to separate different systems in the same location. Many other such hybrids can be used if desired.

As will be recognized by those skilled in the art, the innovative concepts described in the present application can be modified and varied over a tremendous range of applications, and accordingly their scope is not limited except by the allowed claims.

What is claimed is:

1. A wireless-accessible module, comprising:

wireless receiver circuitry to receive a wireless query;

a first manual input to receive a manual start signal;

control circuitry electrically coupled to each of said wireless receiver circuitry and said first manual input, said control circuitry responsive to said wireless query and said manual start signal;

a first transmitter control output generator electrically coupled to said control circuitry, said control circuitry for activating said first transmitter control output generator in response to said wireless query;

a second transmitter control output generator electrically coupled to said control circuitry, said control circuitry further for activating said second transmitter control output generator in response to said manual start signal; and a touch interface adapted for one-wire serial data transmission, said touch interface electrically coupled to said control circuitry, said control circuitry further for deactivating each of said first and second transmitter control output generators in response to access of said touch interface wherein, if said touch interface has not been accessed and said wireless receiver circuitry receives said wireless query, said control circuitry activates said first transmitter control output generator to transmit data as keyed signals of an output frequency with a keying frequency less than said output frequency, and thereafter goes silent, and thereafter goes active again, in a pattern having durations which are varied quasi-randomly, and further wherein if said touch interface has been accessed, said control circuitry deactivates each of said first and second transmitter control output generators and transmits data through said much interface.

2. The wireless-accessible module of claim 1, wherein said wireless-accessible module further comprises a first RF transmitter electrically coupled to said first transmitter control output generator to transmit outputs generated by first transmitter control output generator and a second RF transmitter electrically coupled to said second transmitter control output generator to transmit outputs generated by said second transmitter control output generator.

3. The wireless-accessible module of claim 1, wherein said wireless-accessible module further comprises a first RF transmitting antenna electrically coupled to said first transmitter control output generator to transmit outputs generated by said first transmitter control output generator and a second RF transmitting antenna electrically coupled to said second transmitter control output generator to transmit outputs generated by said second transmitter control output generator.

4. The wireless-accessible module as recited in claim 1, wherein said first manual input is a push button switch.

5. The wireless-accessible module as recited in claim 4, wherein said control circuitry includes memory.

6. The wireless-accessible module as recited in claim 5, wherein said control circuitry further for deactivating said first transmitter control output generator in response to said manual start signal.

7. The wireless-accessible module as recited in claim 1, wherein said control circuitry includes memory.

8. The wireless-accessible module as recited in claim 1, wherein said control circuitry further for deactivating said first transmitter control output generator in response to said manual start signal.

9. A system of base stations and portable data modules, comprising:

(a) a plurality of base stations, each base station of said plurality of base stations with a polling transmitter which broadcasts an unmodulated carrier of a first frequency;

(b) a plurality of portable data modules, each portable data module of said plurality of data modules including a receiver, a transmitter, and a touch interface;

(c) said receiver able to detect said first frequency carriers, and said transmitter broadcasts by keying a carrier of a second frequency, with said second frequency being higher than said first frequency and said keying being synchronized to a subharmonic of said first frequency; and (d) said touch interface adapted for one wire serial data transmissions, wherein said portable data module deactivates said receiver and said transmitter in response to access of said touch interface (e) wherein, if said touch interface has not been accessed and said receiver detects said first frequency carriers, said transmitter broadcasts, and further wherein if said touch interface has been accessed, said portable data module deactivates said receiver and transmitter and transmits data through said touch interface.

10. A data module, comprising:

(a) a memory;

(b) a command receiver for receiving a wireless query;

(c) a touch interface adapted for one wire serial data transmissions;

(d) a memory controller electrically coupled to said memory, said command receiver, and said much interface;

(e) said memory controller responsive to said command receiver receiving said wireless query, said memory controller for outputting a portion of a field of data beginning at an address of said memory, said memory controller containing a programmable truncation value N and said portion of said field of data is the first N bits; and (f) said memory controller further for deactivating said command receiver in response to access of said touch interface (g) wherein, if said touch interface has not been accessed and said command receiver receives said wireless query, said memory controller outputs said portion of a field of data from said memory, and further wherein if said touch interface has been accessed, said memory controller deactivates said command receiver and transmits said portion of a field of data from said memory through said touch interface.

11. A wireless data module, comprising:

(a) a battery;

(b) a memory powered by said battery, said memory storing contents;
(c) wireless receiver circuitry powered by said battery, said wireless receiver circuitry addressable by a non-specific polling signal;
(d) a touch interface adapted for one wire serial data transmissions, said touch interface includes a means for deactivating said wireless receiver circuitry in response to access of said touch interface;
(e) output circuitry powered by said battery, said output circuitry electrically coupled to said wireless receiver circuitry and said touch interface, said output circuitry configured to be activated by a query; and
(f) a control output and first circuitry for keying said control output in response to said query and said contents of said memory, said control output driving said output circuitry, and said first circuitry electrically coupled to said wireless receiver circuitry and said touch interface;
(g) wherein, if said touch interface has not been accessed and said wireless receiver circuitry receives said query, said control output goes active and transmits data as keyed signals of an output frequency with a keying frequency less than said output frequency, and thereafter goes silent, and thereafter goes active again, in a pattern having durations which are varied quasi-randomly and further wherein if said touch interface has been accessed said control output goes active and transmits data through said touch interface.

* * * * *